United States Patent
Komukai et al.

(10) Patent No.: US 12,354,906 B2
(45) Date of Patent: Jul. 8, 2025

(54) METHOD OF MANUFACTURING SEMICONDUCTOR DEVICE AND METHOD OF FORMING PATTERN

(71) Applicant: Kioxia Corporation, Tokyo (JP)

(72) Inventors: Toshiaki Komukai, Yokkaichi (JP); Motofumi Komori, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 424 days.

(21) Appl. No.: 17/930,544

(22) Filed: Sep. 8, 2022

(65) Prior Publication Data
US 2023/0307287 A1   Sep. 28, 2023

(30) Foreign Application Priority Data

Mar. 23, 2022   (JP) ................... 2022-047436

(51) Int. Cl.
*H01L 21/768*   (2006.01)
*H10B 41/50*   (2023.01)

(52) U.S. Cl.
CPC ....... *H01L 21/76802* (2013.01); *H10B 41/50* (2023.02)

(58) Field of Classification Search
CPC ......... H01L 21/76802; H01L 21/76816; H01L 21/76831; H10B 41/50; H10B 43/50
See application file for complete search history.

(56) References Cited

U.S. PATENT DOCUMENTS

| | | | |
|---|---|---|---|
| 10,153,176 B2 | 12/2018 | Soda | |
| 10,423,066 B2 | 9/2019 | Izawa et al. | |
| 10,796,948 B2 | 10/2020 | Mitra et al. | |
| 10,845,609 B2 | 11/2020 | Ahmed et al. | |
| 11,088,164 B2 | 8/2021 | Shimizu | |
| 11,956,959 B2 * | 4/2024 | Fujiki | H01L 21/76897 |
| 2022/0149052 A1 * | 5/2022 | Kim | H10B 69/00 |
| 2022/0319983 A1 * | 10/2022 | Oh | H01L 21/76816 |
| 2023/0307287 A1 * | 9/2023 | Komukai | H01L 21/76802 |

* cited by examiner

*Primary Examiner* — Thanh T Nguyen
(74) *Attorney, Agent, or Firm* — Oblon, McClelland, Maier & Neustadt, L.L.P.

(57) ABSTRACT

A method of manufacturing a semiconductor device includes applying a resin on a first surface of a first layer, the first layer comprising a first hole having a first depth and a second hole having a second depth, forming a pattern on the resin, the pattern comprising a convex part above the first hole a diameter of the convex part being smaller than a diameter of an opening of the first hole, forming a protecting layer exposing a part of the convex part, removing the resin in the first hole, the resin in the hole being connected with the convex part, and processing the first hole to form a third hole connecting with the first hole and having a third depth in the first layer below the first hole.

12 Claims, 19 Drawing Sheets

METHOD OF MANUFACTURING SEMICONDUCTOR DEVICE AND METHOD OF FORMING PATTERN

CROSS REFERENCE TO RELATED APPLICATION(S)

This application is based upon and claims the benefit of priority from the prior Japanese Patent Application JP2022-047436, filed on Mar. 23, 2022, the entire contents of which are incorporated herein by reference.

FIELD

Embodiments described herein relate generally to a method of manufacturing a semiconductor device and a method of forming a pattern.

BACKGROUND

A semiconductor packages using a NAND flash memory are known as the semiconductor device. In order to increase the capacity of such NAND type flash memory, a three-dimensional NAND type flash memory having a structure in which many memory cells are stacked has been put into the practical use. A plurality of a conductive layers connected to the respective memory cells are stacked on the substrate and connected to a drive circuit or the like.

DETAILED DESCRIPTION

Figure 1:
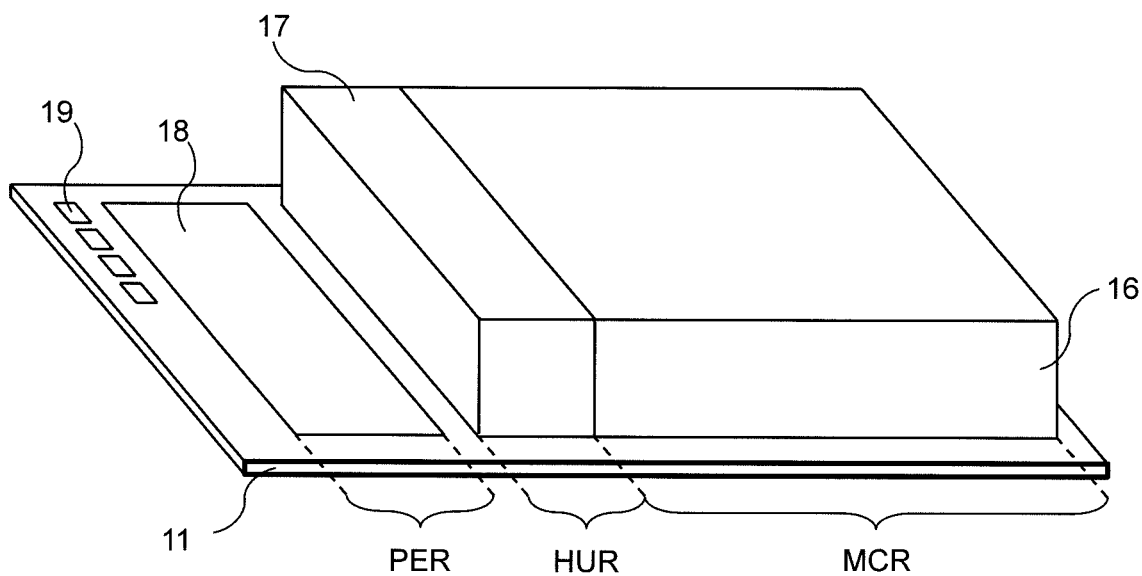
FIG. 1 is a perspective view showing an overall configuration of a semiconductor device according to an embodiment.

Hereinafter, a method of manufacturing a semiconductor device and a method of forming pattern according to the present embodiment will be described in detail with reference to the drawings. In the following description, elements having substantially the same functions and configurations are denoted by the same reference numerals or with the same reference numerals followed by the addition of an alphabet, and will be described in duplicate only when necessary. Each of the embodiments described below exemplifies a device and a method for embodying the technical idea of this embodiment. In one embodiment, various changes may be made without departing from the spirit of the invention. These embodiments and variations thereof are included in the claims described in the invention and the scope of equivalents thereof.

For the sake of clarity of description, the drawings may be schematically represented with respect to widths, thicknesses, shapes, and the like of the respective parts compared with actual embodiments, but are merely an example and do not limit the interpretation of the present invention. In this specification and each drawing, elements having the same functions as those described with reference to the preceding drawings are denoted by the same reference numerals, and a repetitive description thereof may be omitted.

The expression "a includes A, B or C" herein does not exclude the case where a includes multiple combinations of A-C unless otherwise specified. Furthermore, these expressions do not exclude the case where a includes other elements.

In this specification, the horizontal refers to a direction parallel to the substrate (XY direction), the vertical may refer to a direction substantially perpendicular to the horizontal direction (Z direction).

The following embodiments may be combined with each other as long as there is no technical contradiction.

In the following embodiments, a semiconductor substrate is exemplified as the substrate, but the technique of the present disclosure can be applied to a substrate other than a semiconductor substrate.

A method of manufacturing a semiconductor device according to an embodiment includes applying a resin on a first surface of a first layer, the first layer comprising a first hole having a first depth and a second hole having a second depth, forming a pattern on the resin, the pattern comprising a convex part above the first hole a diameter of the convex part being smaller than a diameter of an opening of the first hole, forming a protecting layer exposing a part of the convex part, removing the resin in the first hole, the resin in the hole being connected with the convex part, and processing the first hole to form a third hole connecting with the first hole and having a third depth in the first layer below the first hole.

First Embodiment

[Overall Configuration of the Semiconductor Device]

The overall configuration of the semiconductor device according to the present embodiment will be described with reference to FIG. 1. FIG. 1 is a perspective view showing the arrangement of the elements of the semiconductor device 10 according to the present embodiment.

The semiconductor device 10 is a NAND flash memory device formed on a semiconductor substrate 11. A memory cell region MCR and a contact region HUR are defined on the semiconductor substrate 11. A memory cell array 16 including a plurality of memory cells stacked in the three dimensions is formed in the memory cell region MCR. Specifically, the source-side select gate transistor, a large number (for example, 64 pieces) of the memory cell transistors, and the drain-side select gate transistor is connected in series in a direction perpendicular to the surface of the semiconductor substrate 11 to constitute a memory string. Incidentally, a dummy cell transistor may be included on a both end of the plurality of memory cell transistors connected in series or between a part of the plurality of memory cell transistors. The memory cell array 16 includes a stack body in which a plurality of conductive layers serving as a source-side select gate line, word lines, and a drain-side select gate line connected to each transistor are stacked through an insulating layer, respectively. The plurality of conductive layers extends to the contact region HUR to form a stacked wiring structure 17. A bit line (not shown) is provided on the memory cell array 16 and connected to a peripheral circuit 18. On the stacked wiring structure 17, a wiring (not shown) is provided and is connected to the peripheral circuit 18.

Further on the semiconductor substrate 11, peripheral circuit region PER is partitioned. The peripheral circuit 18 is formed in the peripheral circuit region PER. The peripheral circuitry 18 has a number of CMOS transistors. The peripheral circuit 18 includes a driving circuit for driving each word line connected to the memory cell, a decoder circuit for selecting each word line, a sense amplifier for sensing a bit line potential at the time of reading, and a column system circuit including a bit line potential control circuit for supplying a voltage to the bit line at the time of writing. Incidentally, the wiring of the peripheral circuit region PER is omitted in FIG. 1. The semiconductor substrate 11 has a pad row 19 where it is subjected to receive the supply of the exchange power and a signal of a chip external.

[Configuration of Memory Cell Region MCR and Contact Region HUR]

Figure 2:
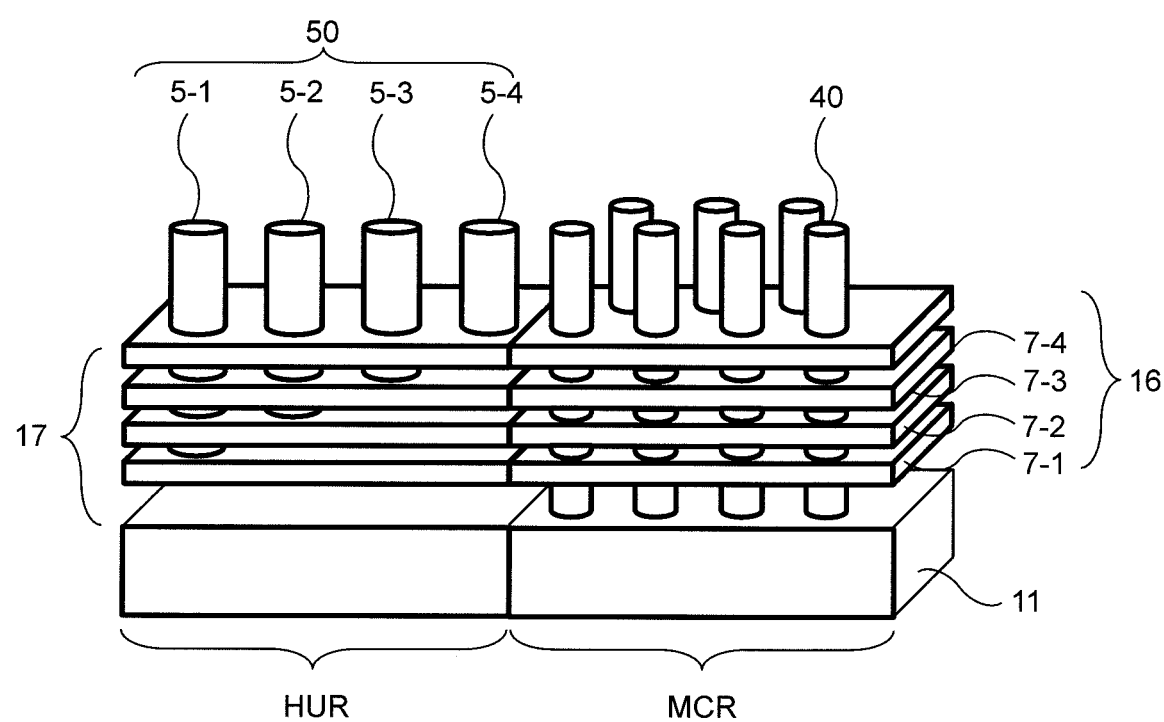
FIG. 2 is a perspective view showing the configuration of a memory cell region MCR and a contact region HUR of a semiconductor device according to an embodiment.

FIG. 2 is a perspective view showing the configuration of the memory cell region MCR and the contact region HUR of the semiconductor device according to the present embodiment. To prevent the illustration to be confused, showed a member having conductivity and omitted member having an insulating property. Parts not shown in FIG. 2 are insulated using an insulating material such as silicon dioxide.

In the memory cell region MCR, a memory cell array 16 is formed on the semiconductor substrate 11 using a silicon single crystal. The memory cell array 16 has a conductive layer 7-1, a conductive layer 7-2, a conductive layer 7-3, and a conductive layer 7-4 (referred to as a conductive layer 70 when the conductive layer 7-1 to the conductive layer 7-4 are not distinguished) extending substantially parallel to the surface of the semiconductor substrate 11. The memory cell array 16 has the stack body in which these the plurality of conductive layers 70 are stacked through the insulating layer, respectively. Although only four conductive layers are shown in the figure, a larger number of layers are stacked, such as 33 layers, 65 layers. These conductive layers correspond to the source side select gate line, the word lines, or the drain side select gate line connected to the transistor.

In the memory cell region MCR, a memory pillar 40 penetrating the plurality of conductive layers and the plurality of insulating layers is formed. The memory pillar 40 is cylindrical, toward the center side from the outer peripheral side, a block insulating film including a silicon dioxide film, a charge storage film including a silicon nitride film, a tunnel insulating film including a silicon dioxide film, a semiconductor channel including an amorphous or polycrystalline silicon film, and a silicon dioxide film are stacked. A part of the charge storage film located between the conductive layers 7-1, 7-2, 7-3, 7-4 corresponding to the select gate line or word lines and the semiconductor channel functions as part of a non-volatile memory cell that traps the carrier.

The contact region HUR, the stacked wiring structure 17 is formed on the semiconductor substrate 11 using a silicon single crystal. Also in the contact region HUR, the plurality of insulating layers and the plurality of conductive layers extending from the memory cell region MCR are formed. The stacked wiring structure 17 has the conductive layer 7-1, the conductive layer 7-2, the conductive layer 7-3, and the conductive layer 7-4 extending substantially parallel to the surface of the semiconductor substrate 11. The stacked wiring structure 17 has the stack body in which these the plurality of conductive layers 70 are stacked through the insulating layer, respectively. Although only four conductive layers are shown in the figure, it is as described above that a larger number of layers are stacked, such as 33 layers, 65 layers. The plurality of conductive layers 70 in the contact region HUR corresponds to the wiring drawn from the source-side select gate line, the word lines, or the drain-side select gate line.

In the contact region HUR, the conductive layers 7-1, 7-2, 7-3, 7-4 corresponding to the wirings drawn from the select gate line or the word lines are connected to a corresponding contact plugs 5-1, 5-2, 5-3, 5-4 (here, referred to as a contact plug 50 when the contact plug 5-1 to the contact plug 5-4 are not distinguished) respectively. Here, the conductive layer 7-1 is connected to the contact plug 5-1, and the conductive layer 7-2 is connected to the contact plug 5-2, conductive layer 7-3 is connected to the contact plug 5-3, and conductive layer 7-4 is connected to the contact plug 5-4. Although only four contact plugs 50 are shown in the figure, for example, the same number as the plurality of conductive layers are disposed. Each of the contact plug 50 is drawn over the stacked wiring structure 17 through a contact hole penetrating the plurality of insulating layers and the plurality of conductive layers.

[Configuration of the Stacked Wiring Structure]

Figure 3:
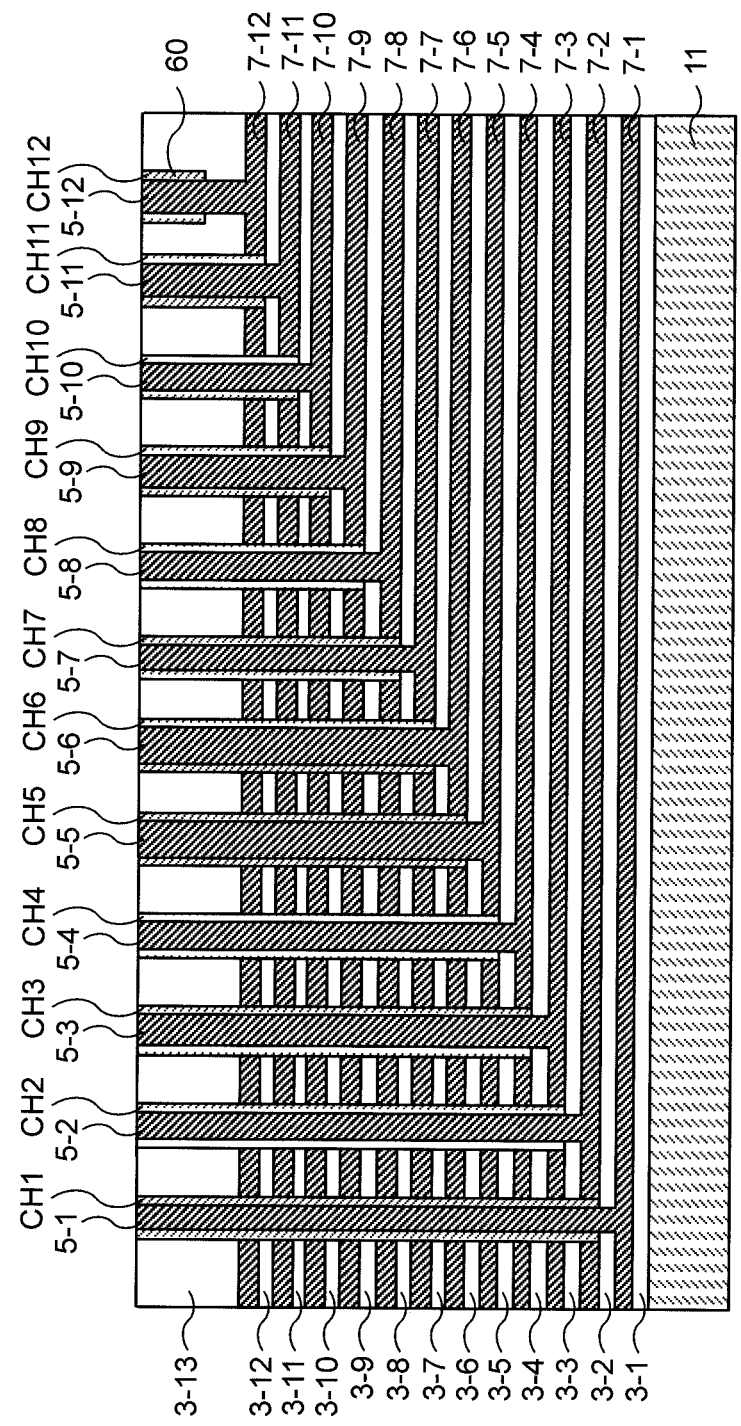
FIG. 3 is a cross-sectional view showing a configuration of a stacked wiring structure of a semiconductor device according to an embodiment.

FIG. 3 is a cross-sectional view showing the configuration of the stacked wiring structure 17. The stacked wiring structure 17 has the insulating layer 3-1, the conductive layer 7-1, the insulating layer 3-2, the conductive layer 7-2, the insulating layer 3-3, the conductive layer 7-3, the insulating layer 3-4, the conductive layer 7-4, the insulating layer 3-5, the conductive layer 7-5, the insulating layer 3-6, the conductive layer 7-6, the insulating layer 3-7, the conductive layer 7-7, the insulating layer 3-8, the conductive layer 7-8, the insulating layer 3-9, the conductive layer 7-9, the insulating layer 3-10, the conductive layer 7-10, the insulating layer 3-11, the conductive layer 7-11, the insulating layer 3-12, the conductive layer 7-12, and the insulating layer 3-13 (here, referred to as a conductive layer 70 when the conductive layer 7-1 to the conductive layer 7-12 are not distinguished, referred to as an insulating layer 30 when the insulating layer 3-1 to the insulating layer 3-12 are not distinguished). Each of the plurality of conductive layers 70 and the plurality of insulating layers 30 are periodically stacked on a direction perpendicular to the main surface of the semiconductor substrate 11 (stacking direction) by stacked alternately one layer by one layer. The insulating layer 3-1 is also formed between the semiconductor substrate 11 and the bottom conductive layer 7-1. The insulating layer 3-13 is also formed on the top conductive layer 7-12. The insulating layer 3-13 may be thicker in the stacking direction than from the insulating layer 3-1 to the insulating layer 3-12.

Each of the conductive layer 70 is a single layer. In other words, when the cross-sectional shape for the conductive layer 70 of one layer is observed, a single material may be continuous in the film thickness direction (Z direction) of the conductive layer 70. Further, an interface may not be inside the conductive layer 70 of one layer. Alternatively, the conductive layer 70 may be two layers of a barrier metal layer and a metal layer. The material of the conductive layer 70 may be, for example, tungsten. The barrier metal layer may be, for example, titanium nitride (TiN) or tantalum nitride (TaN). The conductive layers 70 adjoining in the stacking directions should be insulated from each other, and the material of the insulating layer 30 may be silicon oxide such as silicon dioxide ($SiO_2$) or TEOS (Tetra Ethyl Ortho Silicate). The insulating layers 30 are deposited using, for example, a CVD (Chemical Vapor Deposition) device.

The conductive layer 7-1 to the conductive layer 7-12 are connected to the corresponding contact plugs 5-1, 5-2, 5-3, 5-4, 5-5, 5-6, 5-7, 5-8, 5-9, 5-10, 5-11, 5-12 (here referred to as the contact plug 50 when the contact plug 5-1 to the contact plug 5-12 are not distinguished). Each of the contact plug 50 is drawn on the stacked wiring structure 17 (opposite to the substrate 11) via the contact hole penetrating the insulating layers 30 and the conductive layers 70 disposed on the corresponding conductive layer 70. Specifically, the contact plug 5-1 is connected to the conductive layer 7-1 through a contact hole CH1 passing through the insulating layer 3-2 to the insulating layer 3-13 and the conductive layer 7-2 to the conductive layer 7-12, the contact plug 5-2 is connected to the conductive layer 7-2 through a contact hole CH2 passing through the insulating layer 3-3 to the insulating layer 3-13 and the conductive layer 7-3 to the conductive layer 7-12, the contact plug 5-3 is connected to the conductive layer 7-3 through a contact hole CH3 passing through the insulating layer 3-4 to the insulating layer 3-13 and the conductive layer 7-4 to the conductive layer 7-12, the contact plug 5-4 is connected to the conductive layer 7-4 through a contact hole CH4 passing through the insulating layer 3-5 to the insulating layer 3-13 and the conductive layer 7-5 to the conductive layer 7-12, the contact plug 5-5 is connected to the conductive layer 7-5 through a contact hole CH5 passing through the insulating layer 3-6 to the insulating layer 3-13 and the conductive layer 7-6 to the conductive layer 7-12, the contact plug 5-6 is connected to the conductive layer through a contact hole CH6 passing through the insulating layer 3-7 to the insulating layer 3-13 and the conductive layer 7-7 to the conductive layer 7-12, the contact plug 5-7 is connected to the conductive layer 7-7 through a contact hole CH7 passing through the insulating layer 3-8 to the insulating layer 3-13 and the conductive layer 7-8 to the conductive layer 7-12, the contact plug 5-8 is connected to the conductive layer 7-8 through a contact hole CH8 passing through the insulating layer 3-9 to the insulating layer 3-13 and the conductive layer 7-9 to the conductive layer 7-12, the contact plug 5-9 is connected to the protective layer 7-9 through a contact hole CH9 passing through the insulating layer 3-10 to the insulating layer 3-13 and the conductive layer 7-10 to the conductive layer 7-12, the contact plug 5-10 is connected to the conductive layer 7-10 through a contact hole CH10 passing through the insulating layer 3-11 to the insulating 3-13 and the conductive layer 7-11 to the conductive layer 7-13, the contact plug 5-11 is connected to the conductive layer 7-11 through a contact hole CH11 passing through the insulating layer 3-12 to the insulating layer 3-13 and the conductive layer 7-12, and the contact plug 5-12 is connected to the insulating conductive layer 7-12 through the contact hole CH12 passing through the insulating layer 3-13 (here, referred to as a contact hole CH when the contact hole CH1 to the contact hole CH12 are not distinguished). That is, each contact hole CH and each contact plug 50 is different depth from the top surface of the stacked wiring structure 17. Although the contact plugs 50 are cylindrical, the shape of the contact plugs 50 are not particularly limited. The material of the contact plug 50 may be, for example, a metal such as tungsten.

Each of the contact plug 50 is insulated from the conductive layer 70 of the upper layer through which the contact hole CH penetrate by the insulating film 60. The insulating film 60 is formed in a cylindrical shape on at least a part of the inner surface of the contact hole CH. That is, the outer surface of at least a part of the contact plug 50 is covered with an insulating film 60. The insulating film 60 may be made of, for example, silicon oxide such as $SiO_2$ or TEOS.

[Method of Manufacturing a Stacked Wiring Structure]

Referring to FIG. 4 to FIG. 15, a method for manufacturing a stacked wiring structure of a semiconductor device according to the present embodiment. FIG. 4 to FIG. 11 show a method of forming pattern of the stacked wiring structure 17. FIG. 12 to FIG. 15 show a method of forming wiring of the stacked wiring structure 17. Although in FIG. 4 to FIG. 15 has shown an example of forming the contact hole CH and the contact plug 50 of different depths in the lateral direction of the paper, the method of manufacturing the stacked wiring structure of the semiconductor device according to the present embodiment can also be applied in the direction of depth of the paper.

Figure 4:
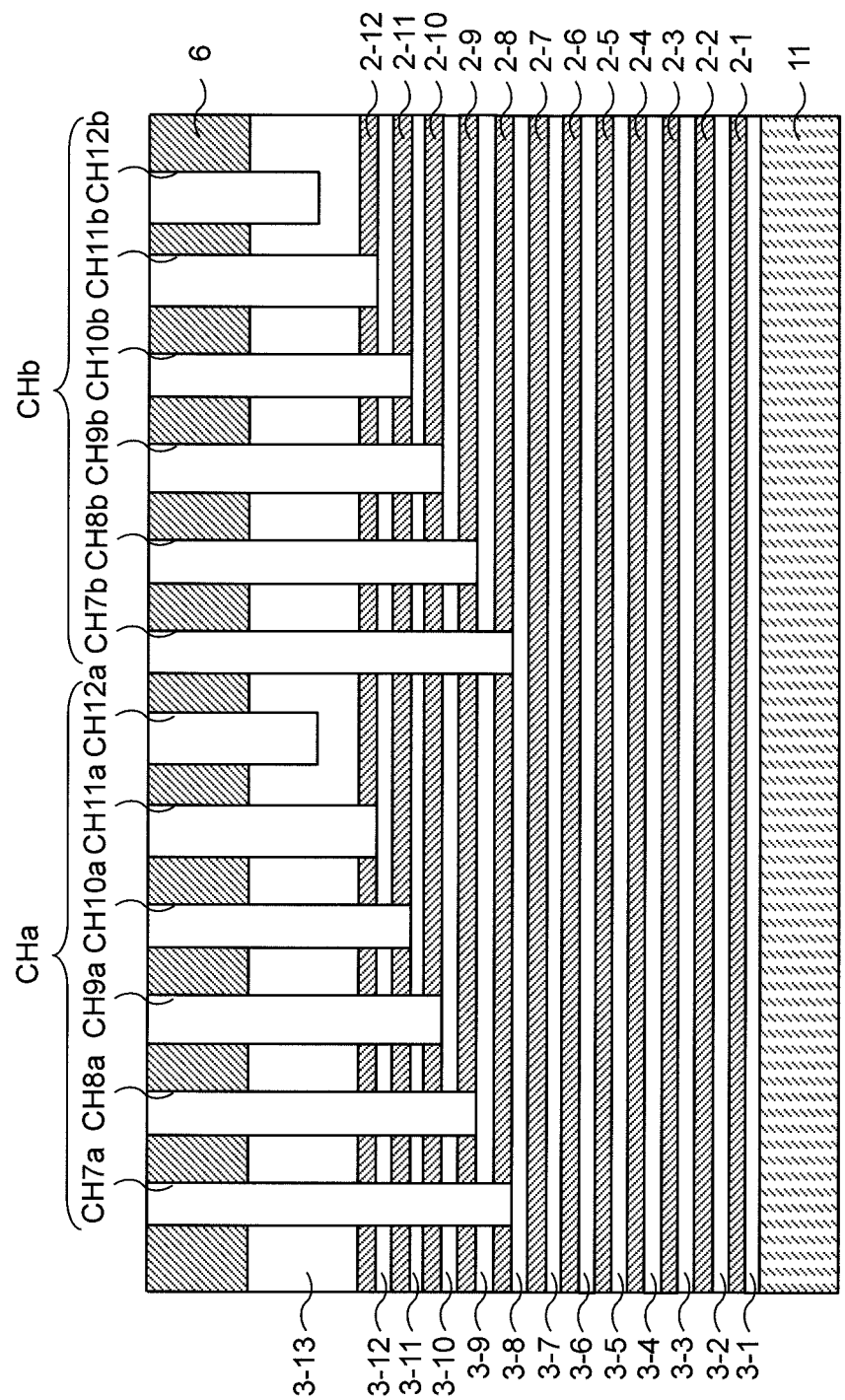
FIG. 4 is a cross-sectional view showing a method of manufacturing a stacked wiring structure according to an embodiment.

First, as shown in FIG. 4, on the semiconductor substrate 11, the insulating layer 3-1 (TEOS film), a sacrificial layer 2-1 (SiN film), the insulating layer 3-2 (TEOS film), a sacrificial layer 2-2 (TEOS film), the insulating layer 3-3 (TEOS film), a sacrificial layer 2-3 (SiN film), the insulating layer 3-4 (TEOS film), a sacrificial layer 2-4 (SiN film), the insulating layer 3-5 (TEOS film), a sacrificial layer 2-5 (SiN film), the insulating layer 3-6 (TEOS film), a sacrificial layer 2-6 (SiN film), the insulating layer 3-7 (TEOS film), a sacrificial layer 2-7 (SiN film), the insulating layer 3-8 (TEOS film), a sacrificial layer 2-8 (SiN film), the insulating layer 3-9 (TEOS film), a sacrificial layer 2-9 (SiN film), the insulating layer 3-10 (TEOS film), a sacrificial layer 2-10

(SiN film), the insulating layer 3-11 (TEOS film), a sacrificial layer 2-11 (SiN film), the insulating layer 3-12 (TEOS film), a sacrificial layer 2-12 (SiN film), the insulating layer 3-13 (TEOS film), and the insulating layer 6 (amorphous silicon film) are formed in this order to form the stack body (here, referred to a sacrificial layer 20 when the sacrificial layer 2-1 to the sacrificial layer 2-12 are not distinguished). These sacrificial layers 20, the insulating layers 30, and the insulating layers 6 are deposited using, for example, the CVD device. The insulating layer 30 and the sacrificial layer 20 stacked alternately are formed in contact with each other. The insulating layer 6 is formed so as to contact on the insulating layer 3-13. In the present embodiment, the material of the insulating layer 30 is exemplified by the TEOS film, but the material of the insulating layer 30 is not limited to this, and may be, for example, ($SiO_2$). The material of the sacrificial layer 20 is exemplified by the silicon nitride film (SiN), but the material of the sacrificial layer 20 is not limited to this, and may be, for example, silicon. The material of the insulating layer 6 is exemplified by an amorphous silicon film.

A contact hole CH7a, CH8a, CH9a, CH10a, CH11a, CH12a, CH7b, CH8b, CH9b, CH10b, CH11b, CH12b is formed on the stack body (here, referred to as a contact hole CHa (a first hole) when the contact hole CH7a to the contact hole CH12a are not distinguished, and referred to as a contact hole CHb (a second hole) when the contact hole CH7b to the contact hole CH12b are not distinguished). Here the contact hole CH7a, CH8a, CH9a, CH10a, CH11a, CH12a have the respectively different depth from the top surface of the stacked wire structure 17. CH7b, CH8b, CH9b, CH10b, CH11b, CH12b have the respectively different depth from the top surface of the stacked wire structure 17.

Specifically, the contact hole CH7a and the contact hole CH7b are connected to the insulating layer 3-8 through the insulating layer 6, from the insulating layer 3-9 to the insulating layer 3-13 and from the sacrificial layer 2-8 to the sacrificial layer 2-12, the contact hole CH8a and CH8b are connected to the insulating layer 3-9 through the insulating layer 6, from the insulating layer 3-10 to the insulating layer 3-13 and from the sacrificial layer 2-9 to the sacrificial layer 2-12, the contact hole CH9a and the contact hole CH9b are connected to the insulating layer 3-10 through the insulating layer 6, from the insulating layer 3-11 to the insulating layer 3-13 and from the sacrificial layer 2-10 to the sacrificial layer 2-12, the contact hole CH10a and the contact hole CH10b is connected to the insulating layer 3-11 through the insulating layer 6, from the insulating layer 3-12 to the insulating layer 3-13 and from the sacrificial layer 2-11 to the sacrificial layer 2-12, the contact hole CH11a and the contact hole CH11b are connected to the insulating layer 3-12 through the insulating layer 6, the insulating layer 3-13 and the sacrificial layer 2-12, and the contact hole CH12a and the contact hole CH12b are connected to the insulating layer 3-13 through the insulating layer 6. The contact holes CHa and CHb are formed by anisotropic etching such as Reactive Ion Etching. Although the present embodiment showed the configuration of the contact hole CHa and the contact hole CHb each including six contact holes having different depths, the contact hole CHa and the contact hole CHb may be one or more, and the contact hole CHa and the contact hole CHb may have the same depth.

Figure 5:
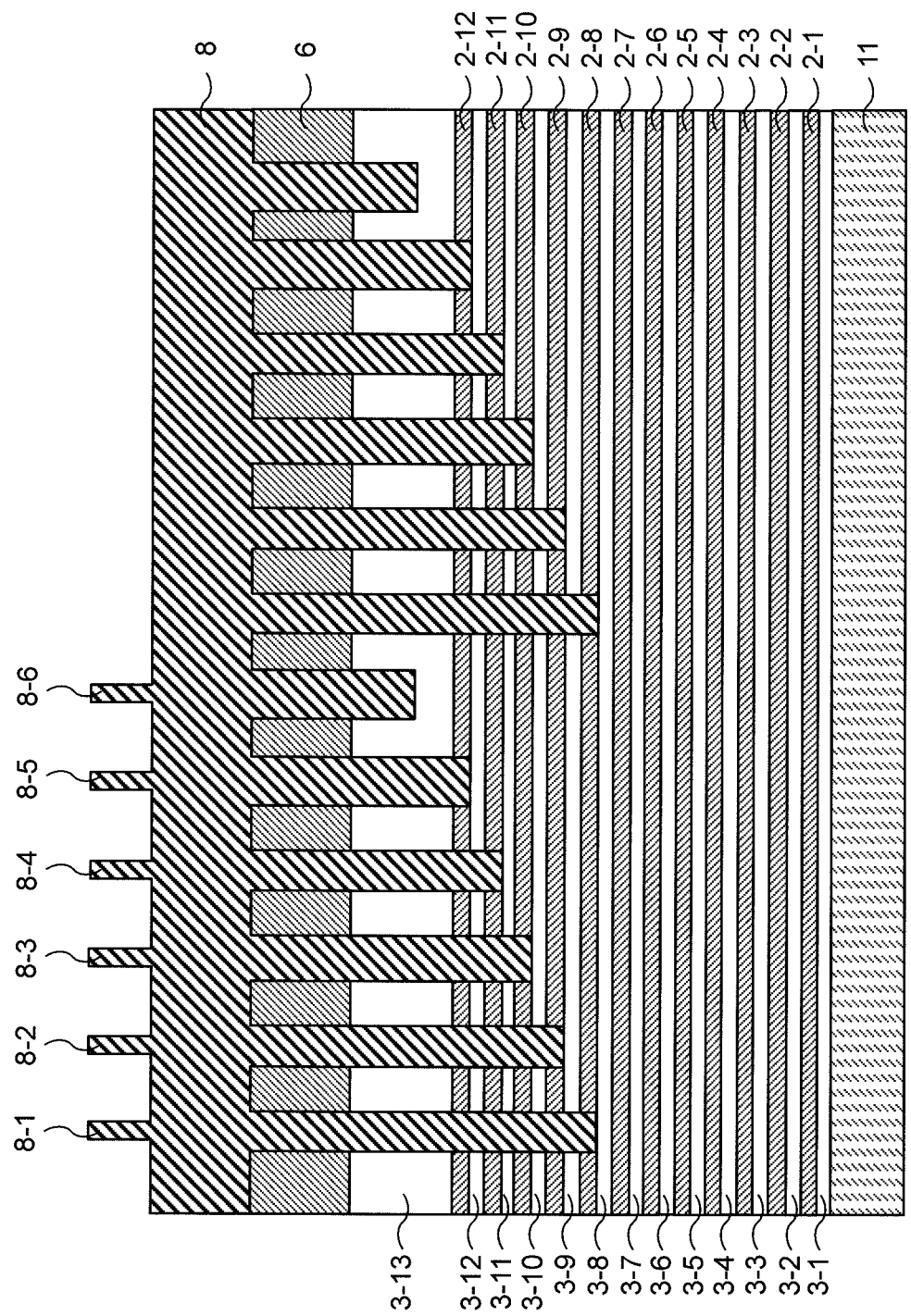
FIG. 5 is a cross-sectional view showing a method of manufacturing a stacked wiring structure according to an embodiment.

As shown in FIG. 5, first applying a resin layer 8 on the top surface of the insulating layer 6 (the surface opposite to the substrate 11 (the first surface)) of the stack body (a first layer) having a contact hole CHa and the contact hole CHb.

The resin layer 8, for example, may be dropped by ink jet or applied by spin coating. The material of the resin layer 8 may be, for example, an NIL resist, and may be a resin containing a photosensitive agent having UV curability. The material of the resin layer 8 may be, for example, an acrylic monomer containing a photoinitiator and a surfactant.

The resin layer 8 applied to the top surface of the insulating layer 6 is embedded in the contact hole CHa and the contact hole CHb formed in the stack body by nanoimprint lithography. Further, the top surface of the resin layer 8 is partially planarized and partially patterned by nanoimprint lithography. Nanoimprint lithography uses a template that is partially flat and partially recessed. By stamping templates on the resin layer 8, the resin layer 8 on the contact holes CHb are flattened, and patterns having a convex part 8-1 on the contact hole CH7a, a convex part 8-2 on the contact hole CH8a, a convex part 8-3 on the contact hole CH9a, a convex part 8-4 on the contact hole CH10a, a convex part 8-5 on the contact hole CH11a, and a convex part 8-6 on the contact hole CH12a are formed (referred to as a convex part 80 when the convex parts 8-1 to 8-6 are not distinguished) on the resin layer 8.

A cross section in the horizontal direction of the convex part 80 is smaller than the opening of the contact hole CHa on the top surface (the surface opposite to the substrate 11 (the first surface)) of the insulating layer 6, and the convex part 80 is disposed on the opening of the contact hole CHa. That is, the diameter of the convex part 80 in the horizontal direction is smaller than the diameter of the contact hole CHa on the top surface (the surface opposite to the substrate 11 (the first surface)) of the insulating layer 6. The diameter may represent, for example, the maximum diameter. Since the cross section of the convex part 80 in the horizontal direction is smaller than the opening of the contact hole CHa on the top surface (the surface opposite to the substrate 11 (the first surface)) of the insulating layer 6, even if the center of the convex part 80 and the center of the contact hole CHa is displaced, the convex part 80 can be arranged without protruding from the opening of the contact hole CHa. The height of each of the convex parts 80 from the top surface (the surface opposite to the substrate 11 (the first surface)) of the insulating layer 6 is substantially the same. The height of the convex part 80 in the vertical direction is not particularly limited, but is higher than the thickness H2 of the protective layer 9, which will be described later. The diameter of the convex part 80 indicates the maximum width of the cross section in the horizontal direction, the diameter of the contact hole CHa indicates the maximum width of the opening on the top surface (the surface opposite to the substrate 11 (the first surface)) of the insulating layer 6.

Figure 6:
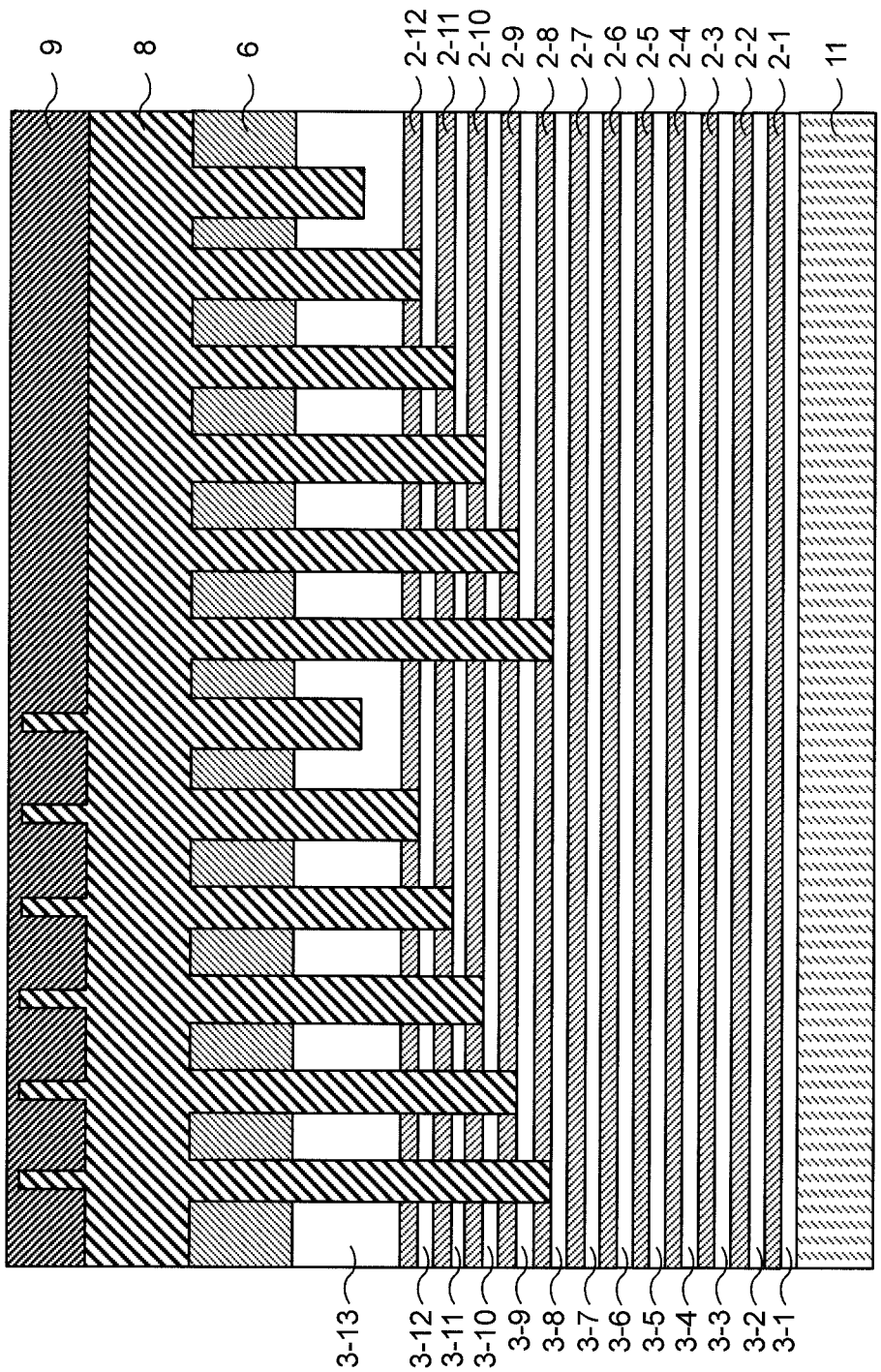
FIG. 6 is a cross-sectional view showing a method of manufacturing a stacked wiring structure according to an embodiment.

As shown in FIG. 6, a protective layer 9 is formed on the top surface (the surface opposite to the substrate 11) of the resin layer 8. The protective layer 9 may be applied, for example, by spin coating. The material of the protective layer 9 may be, for example, a coating type oxide film such as silicon dioxide ($SiO_2$), SOG (Spin-On-Glass), or the like. The protective layer 9 is formed so as to cover the convex part 80 disposed on the top surface of the resin layer 8. The top surface of the protective layer 9 (the surface opposite to the substrate 11) is substantially flattened.

Figure 7:
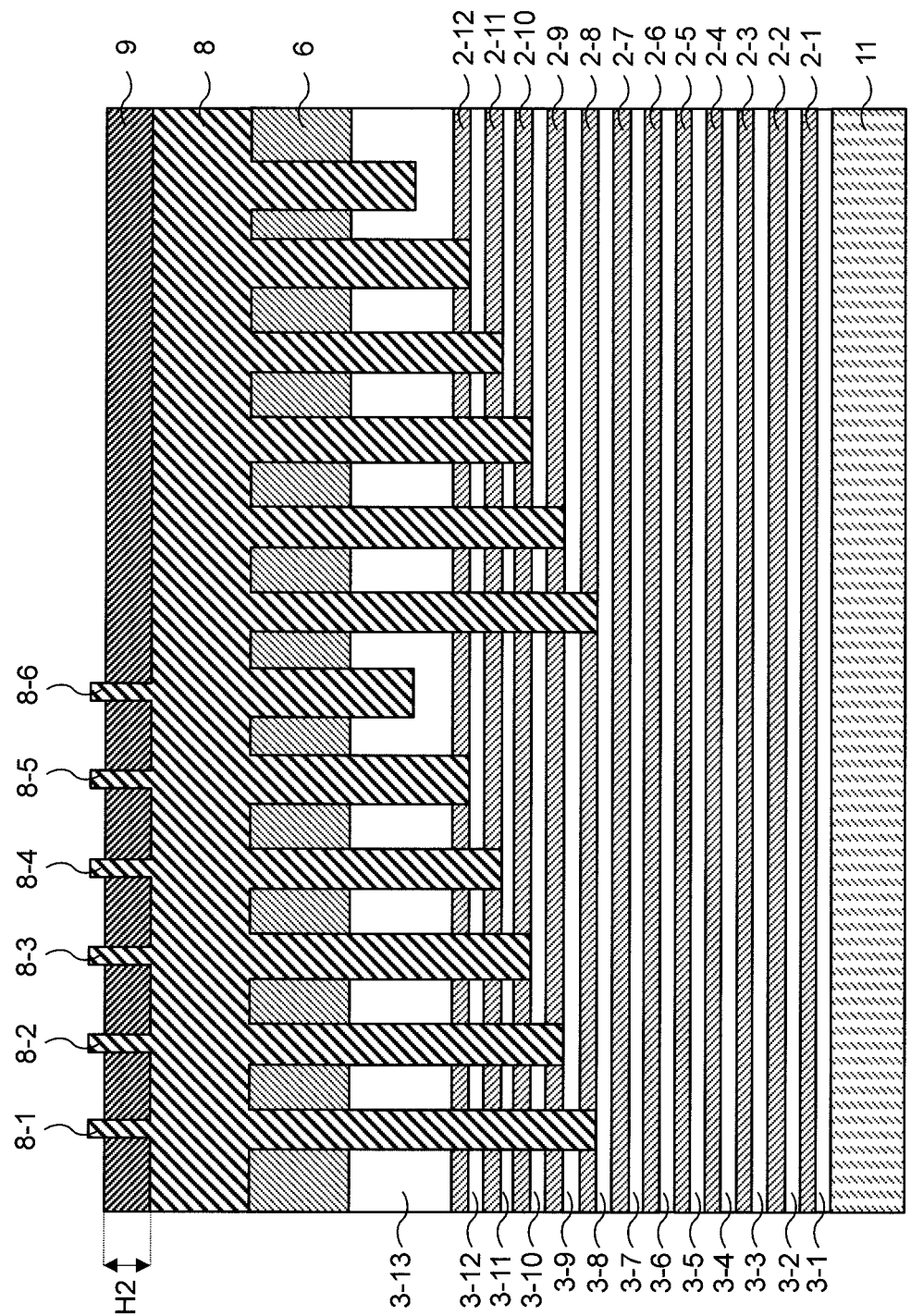
FIG. 7 is a cross-sectional view showing a method of manufacturing a stacked wiring structure according to an embodiment.

As shown in FIG. 7, a part of the protective layer 9 is removed by a first etching. The first etching may be, for example, RIE using a CF-based gas and an oxygen-based gas. The resin layer 8 has a high selectivity in the first etching with respect to the protective layer 9. Therefore, the protective layer 9 can be selectively etched. By removing a part of the protective layer 9, the thickness of the protective layer 9 becomes H2, and a part of the convex part 80 is exposed on the top surface (the surface opposite to the substrate 11 (the first surface)) of the protective layer 9.

Figure 8:
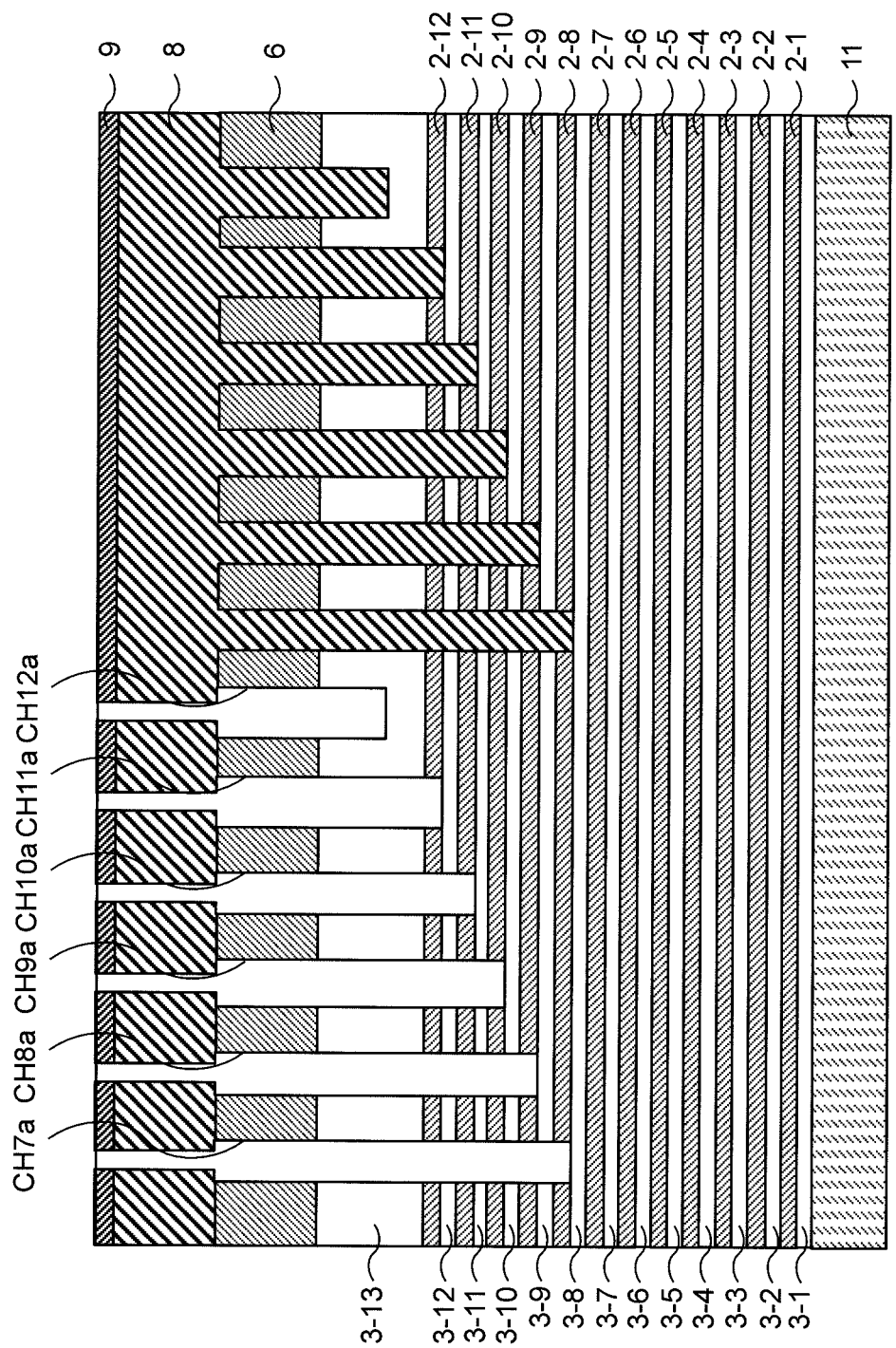
FIG. 8 is a cross-sectional view showing a method of manufacturing a stacked wiring structure according to an embodiment.

As shown in FIG. 8, the resin layer 8 in the contact hole CHa connected to the convex part 80 is removed by a second etching. The second etching may be, for example, RIE using a CF-based gas and an oxygen-based gas. The protective layer 9 has a high selectivity in the second etching with respect to the resin layer 8. Therefore, the resin layer 8 can be selectively etched. Using the protective layer 9 as a mask, the resin layer 8 in the contact hole CHa connected to the convex part 80 exposed on the top surface (the surface opposite to the substrate 11 (the first surface)) of the protective layer 9 can be removed. The protective layer 9 in FIG. 8 remains partially.

Figure 9:
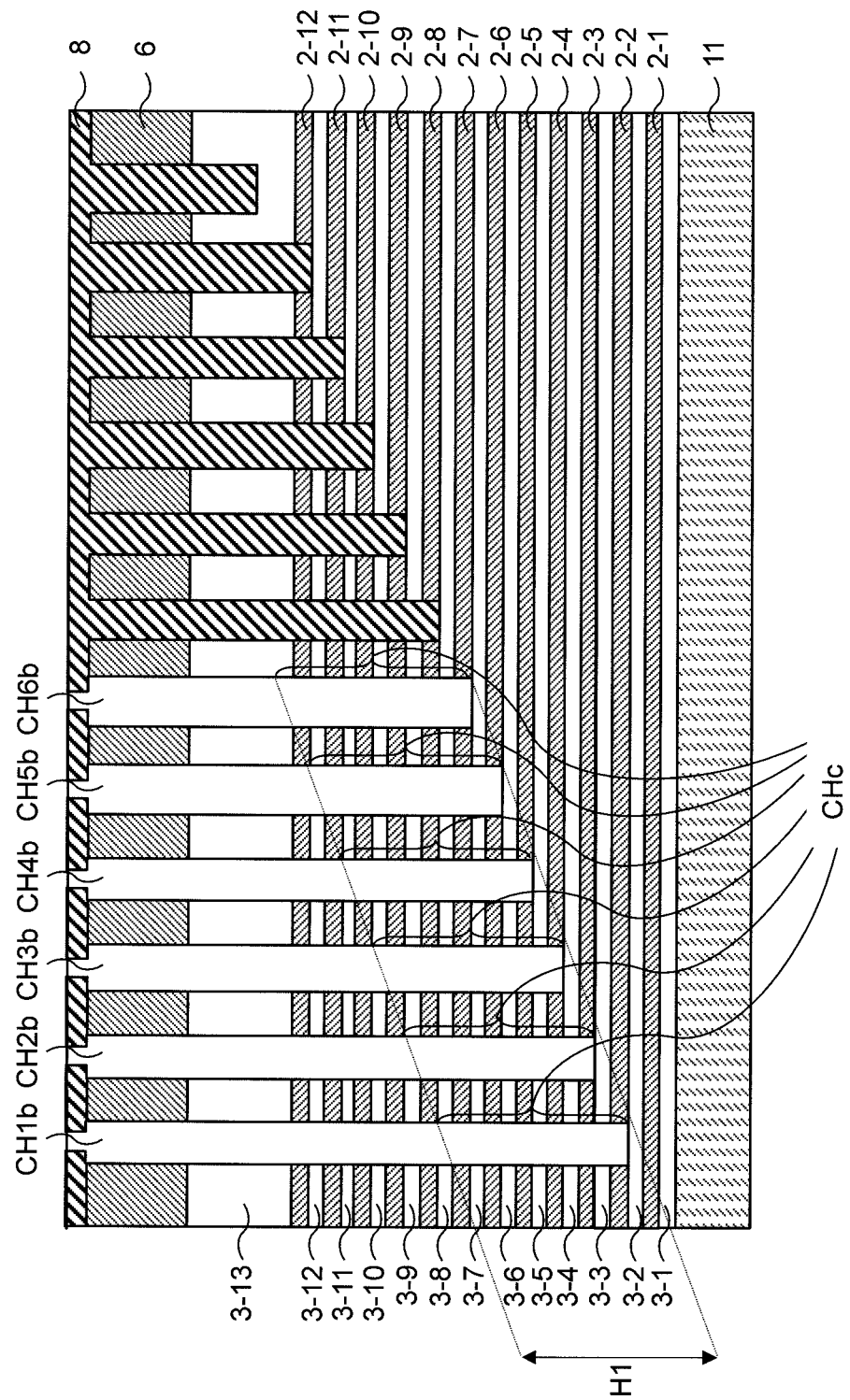
FIG. 9 is a cross-sectional view showing a method of manufacturing a stacked wiring structure according to an embodiment.

As shown in FIG. 9, the sacrificial layers 20 and the insulating layers 30 under the contact hole CHa are removed by a third etching. The third etching may be, for example, RIE using a CF-based gas. The protective layer 9 and the resin layer 8 have a high selectivity in the third etching with respect to the sacrifice layers 20 and the insulating layers 30. Therefore, the sacrifice layer 20 and the insulating layer 30 can be selectively etched. By removing the sacrifice layer 20 and the insulating layer 30 under the contact hole CHa from the opening of the protective layer 9 and the resin layer 8 using the protective layer 9 and the resin layer 8 as a mask, a contact hole CHc (a third hole) communicating with the contact hole CHa can be formed.

FIG. 9, showed an example of forming CH1$b$, CH2$b$, CH3$b$, CH4$b$, CH5$b$, CH6$b$ having the different depths (here referred to as a contact hole CHb when the contact hole CH1$b$ to the contact hole CH6$b$ are not distinguished) by forming a contact hole CHc (the third hole) of the same depth (a third depth) below the respective contact holes CHa of different depths by removing the 6 layers of the insulating layers 30 and the 6 layers of the sacrificial layers 20. Specifically, the contact hole CH1$b$ is connected to the insulating layer 3-2 by removing the insulating layer 3-3 to the insulating layer 3-8 and removing the sacrificial layer 2-2 to the sacrificial layer 2-7 below the contact hole CH7$a$, the contact hole CH2$b$ is connected to the insulating layer 3-3 by removing the insulating layer 3-4 to the insulating layer 3-9 and removing the sacrificial layer 2-3 to the sacrificial layer 2-8 below the contact hole CH8$a$, the contact hole CH3$b$ is connected to the insulating layer 3-4 by removing the insulating layer 3-5 to the insulating layer 3-10 and removing the sacrificial layer 2-4 to the sacrificial layer 2-9 below the contact hole CH9$a$, the contact hole CH4$b$ is connected to the insulating layer 3-5 by removing the insulating layer 3-6 to the insulating layer 3-11 and removing the sacrificial layer 2-5 to the sacrificial layer 2-10 below the contact hole CH10$a$, the contact hole CH5$b$ is connected to the insulating layer 3-6 by removing the insulating layer 3-7 to the insulating layer 3-12 and removing the sacrificial layer 2-6 to the sacrificial layer 2-11 below the contact hole CH11$a$, and the contact hole CH6$b$ is connected to the insulating layer 3-7 by removing the insulating layer 3-8 to the insulating layer 3-13 and removing the sacrificial layer 2-7 to the sacrificial layer 2-12 below the contact hole CH12$a$. However, the number of layers of the sacrificial layers 20 and the insulating layers 30 is not limited to this, and can be adjusted as appropriate.

Here, when the depth of the contact hole CHc in the stacking direction in FIG. 9 is H1, the thickness of the protective layer 9 exposing the convex part 80 in FIG. 7 is H2, the etching rate of the six sacrificial layer 20 and the six insulating layer 30 when forming the contact hole CHc is R1, and the etching rate of the protective layer 9 when forming the contact hole CHc is R2, the relation of H2>(R2/R1)×H1 is satisfied.

Figure 10:
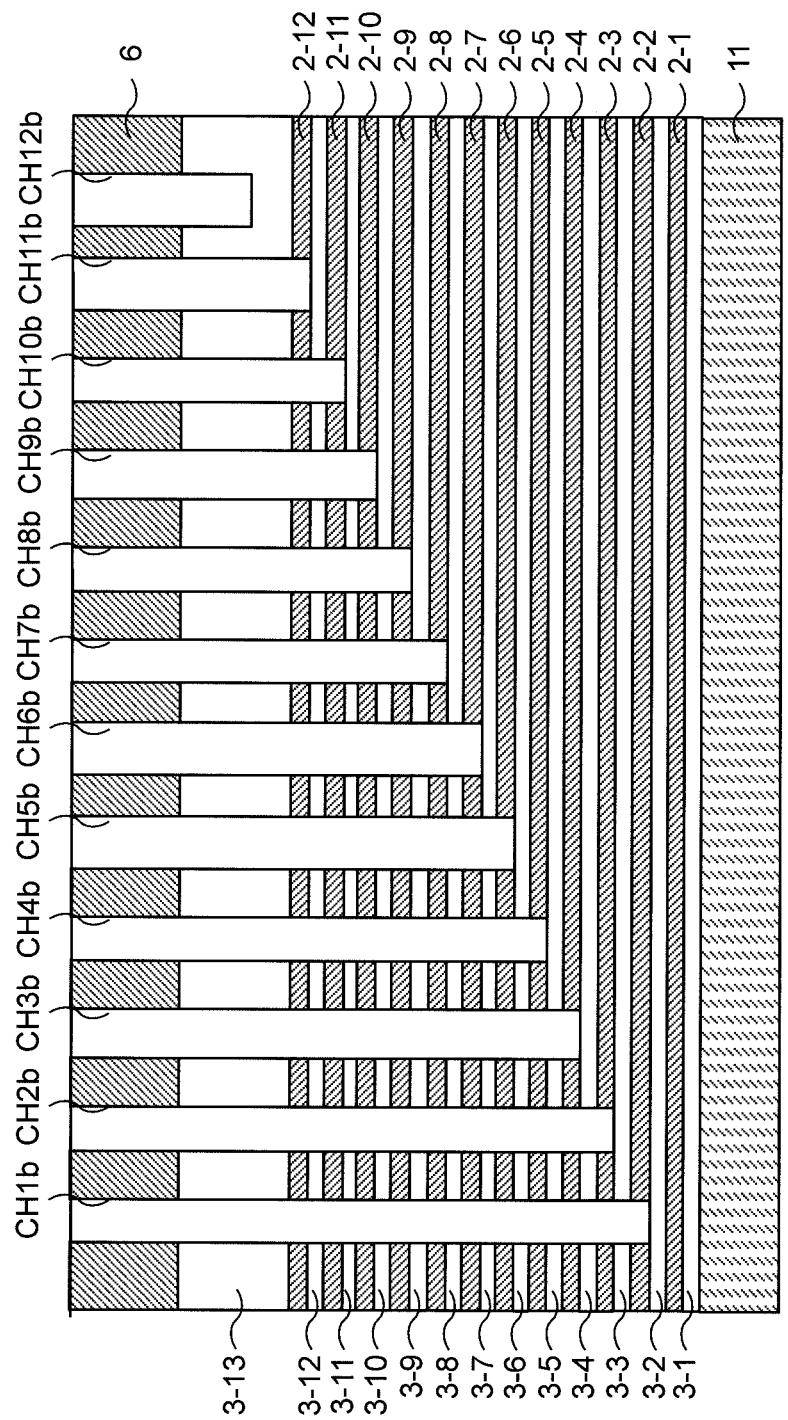
FIG. 10 is a cross-sectional view showing a method of manufacturing a stacked wiring structure according to an embodiment.

As shown in FIG. 10, the resin layer 8 remaining on the top surface (the surface opposite to the substrate 11 (the first surface)) of the insulating layer 6 of the stack body and remaining in the contact hole CHb (an insulating film substrate) are removed by ashing.

Figure 11:
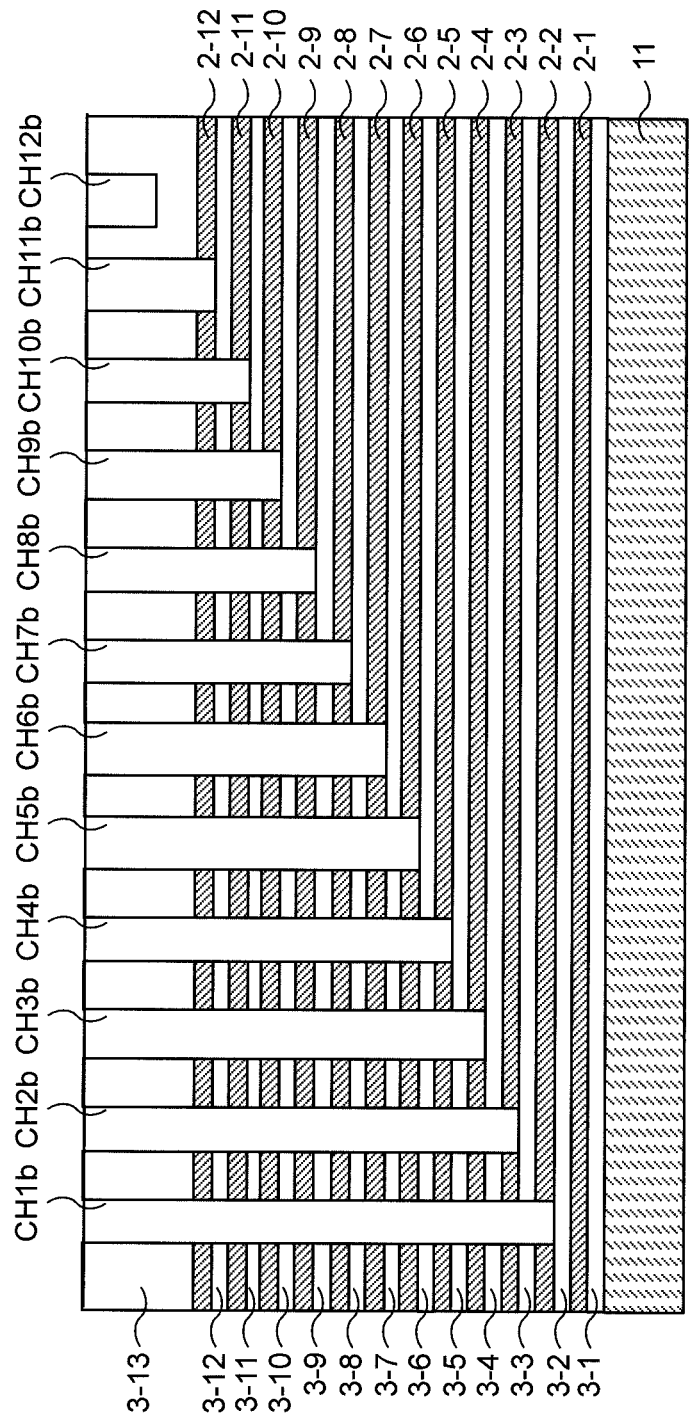
FIG. 11 is a cross-sectional view showing a method of manufacturing a stacked wiring structure according to an embodiment.

As shown in FIG. 11, the insulating layer 6 is removed by a fourth etching. The fourth etching may be, for example, RIE using an HBr-based gas. The insulating layer 6 has a high selectivity in the fourth etching with respect to the insulating layer 30. Therefore, the insulating layer 6 can selectively etch the insulating layer 30 as an etching stopper.

In the method of forming pattern of the stacked wiring structure according to the present embodiment, dimensional variation of the contact hole can be suppressed by flattening and patterning the top surface of the resin layer 8 by nanoimprint lithography, even in a region where shallow contact holes are arranged and a region where deep contact holes are arranged, or even in a region where the contact holes are arranged densely and roughly. In addition, since the contact hole CHc can be formed by the stacked mask structure of the protective layer 9 and the resin layer 8, the shortage of the residual film of the mask can be solved, and the contact hole can be miniaturized.

Figure 12:
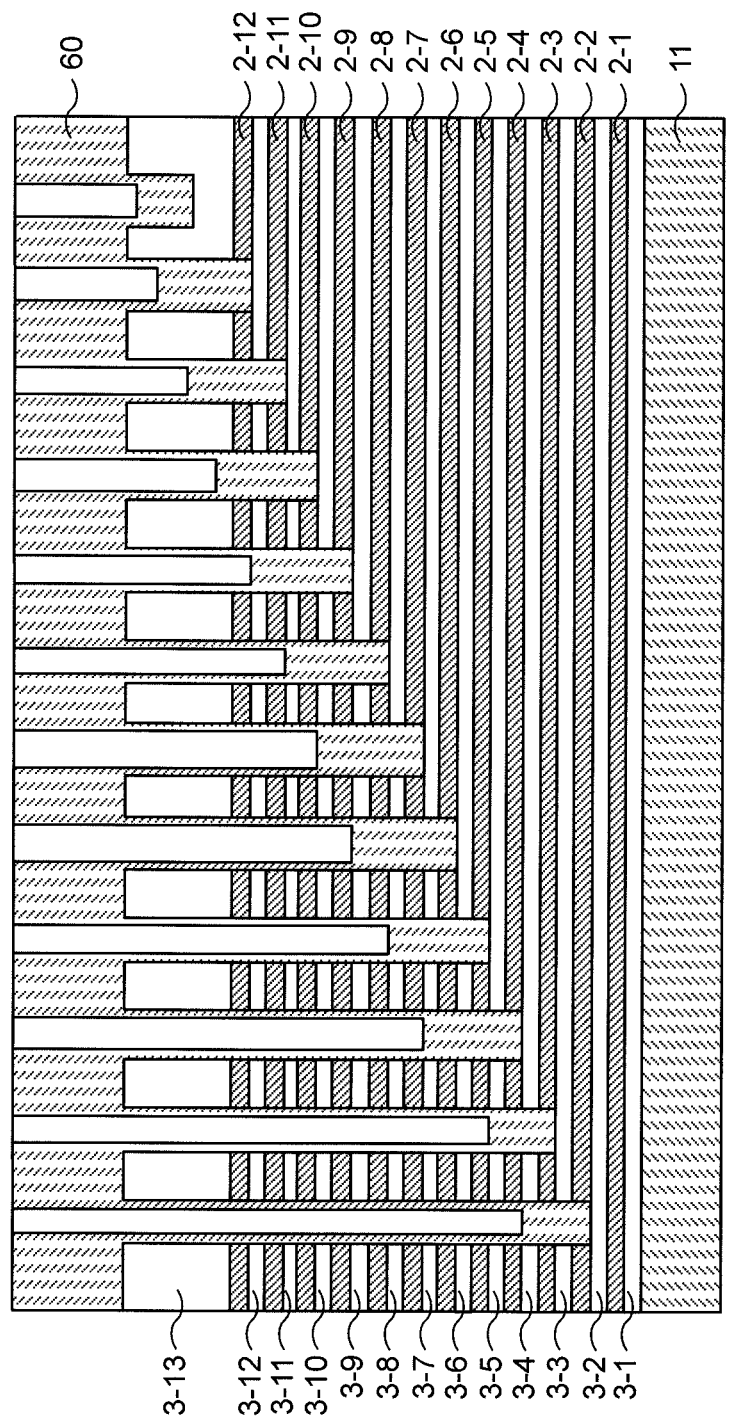
FIG. 12 is a cross-sectional view showing a method of manufacturing a stacked wiring structure according to an embodiment.

As shown in FIG. 12, the insulating film 60 is formed on the top surface of the stack body, the inner surface and the bottom of the contact hole CHb. The insulating film 60 may be, for example, silicon oxide, and is deposited using the CVD device.

Figure 13:
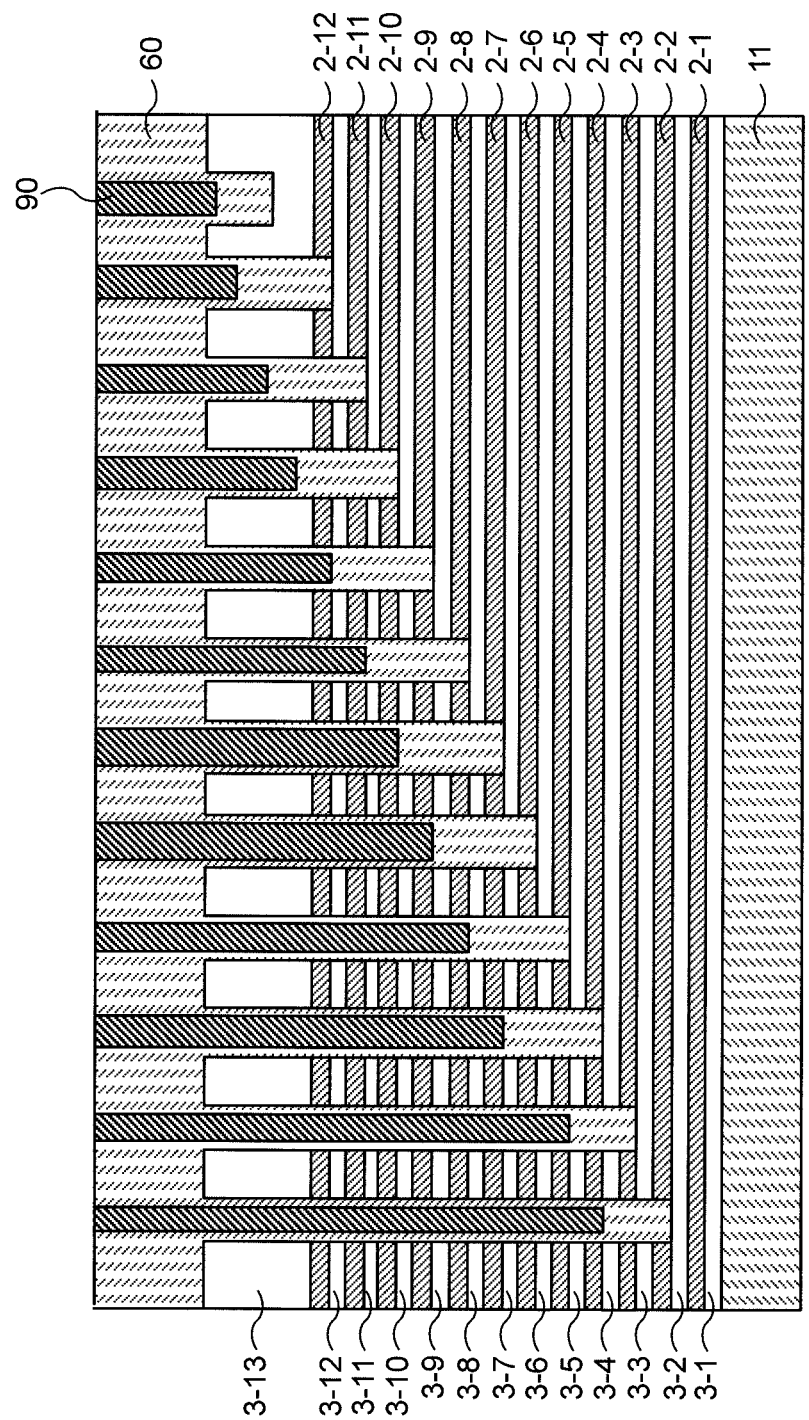
FIG. 13 is a cross-sectional view showing a method of manufacturing a stacked wiring structure according to an embodiment.

As shown in FIG. 13, an insulator 90 is formed inside the contact hole CHb. The insulator 90 may be, for example, amorphous silicon and may be deposited using the CVD device.

Figure 14:
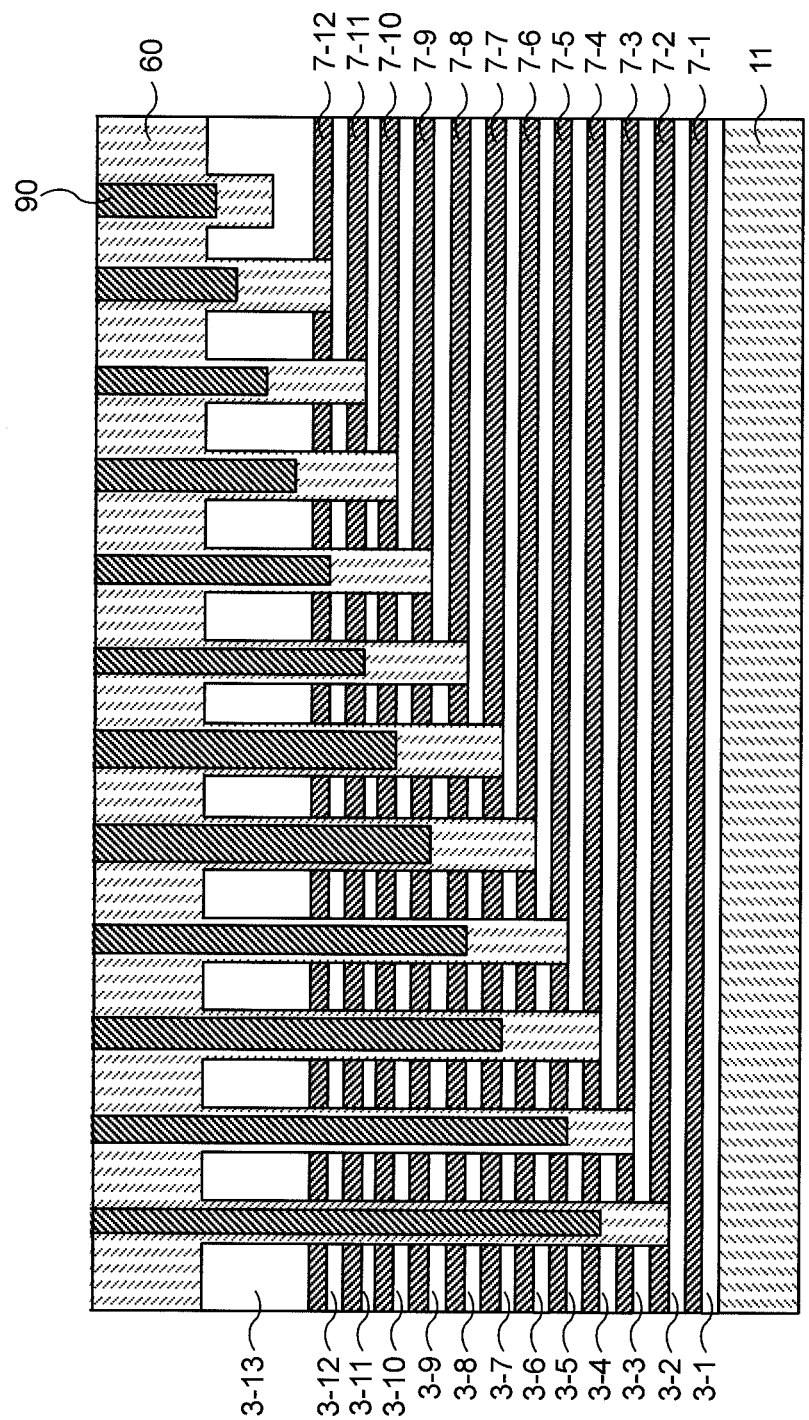
FIG. 14 is a cross-sectional view showing a method of manufacturing a stacked wiring structure according to an embodiment.

As shown in FIG. 14, the conductive layer 70 is formed in the region where the sacrificial layer 20 is disposed. A slit (not shown) is dug down in a predetermined region of the stack body, and the sacrifice layer 20 included in the stack body is collectively removed from the slit. As a result, a cavity is formed in the part where the sacrificial layer 20 was present. Then, by embedding a metal such as tungsten in the cavity, the conductive layer 70 is formed.

Figure 15:
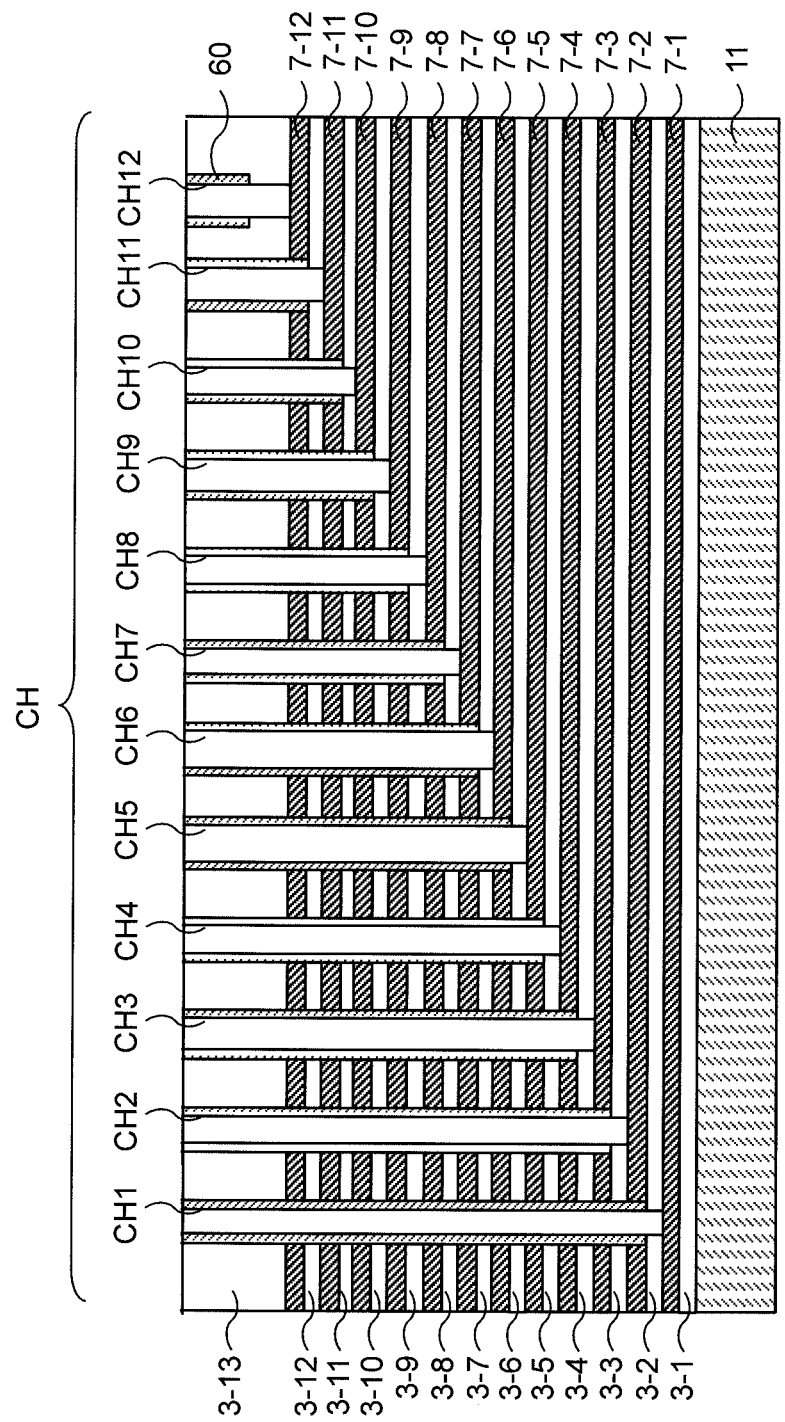
FIG. 15 is a cross-sectional view showing a method of manufacturing a stacked wiring structure according to an embodiment.

As shown in FIG. 15, remove the insulator 90 in the contact hole CHb, the insulating film 60 of the top surface of the stack body and the bottom of the contact hole, and the insulating layer 30 connected by each contact hole CHb by anisotropic etching such as RIE. Etching may be, for example, RIE using HBr-based gas for the insulator 90, and using CF-based gas and oxygen-based gas for the insulating film 60. By removing the insulating film 60 and the insulating layer 30 located under the insulator 90, the insulating film 60 remains on the inner surface of the contact hole CH.

The contact plugs 50 shown in FIG. 3 are formed, for example, by embedding a metal such as tungsten in the contact hole CH exposing the corresponding conductive layer 70 at the bottom.

In the method of forming wiring of the stacked wiring structure according to the present embodiment, it is possible to improve the manufacturing efficiency and reliability.

Second Embodiment

The configuration of the stacked wiring structure according to the present embodiment is the same as the configuration of the stacked wiring structure according to the first embodiment. The method of manufacturing the stacked wiring structure according to the present embodiment is the same as the method of manufacturing the stacked wiring structure according to the first embodiment except for the method of forming the resin layer. The description is the same as that of the first embodiment will be omitted, here will be described parts different from the method of manufacturing stacked wiring structure according to the first embodiment.

[Method of Manufacturing a Stacked Wiring Structure]

Figure 16:
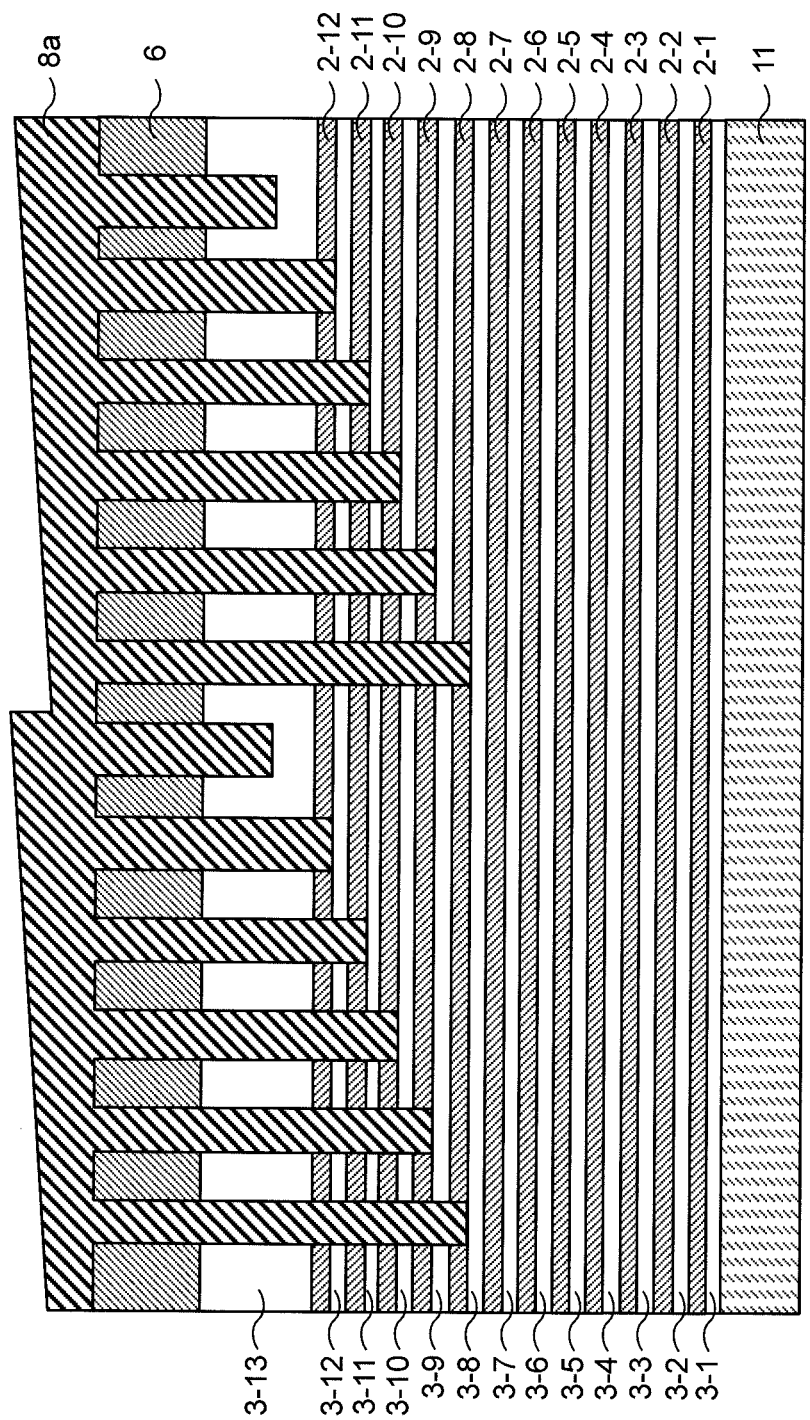
FIG. 16 is a cross-sectional view showing a method of manufacturing a stacked wiring structure according to an embodiment.
Figure 17:
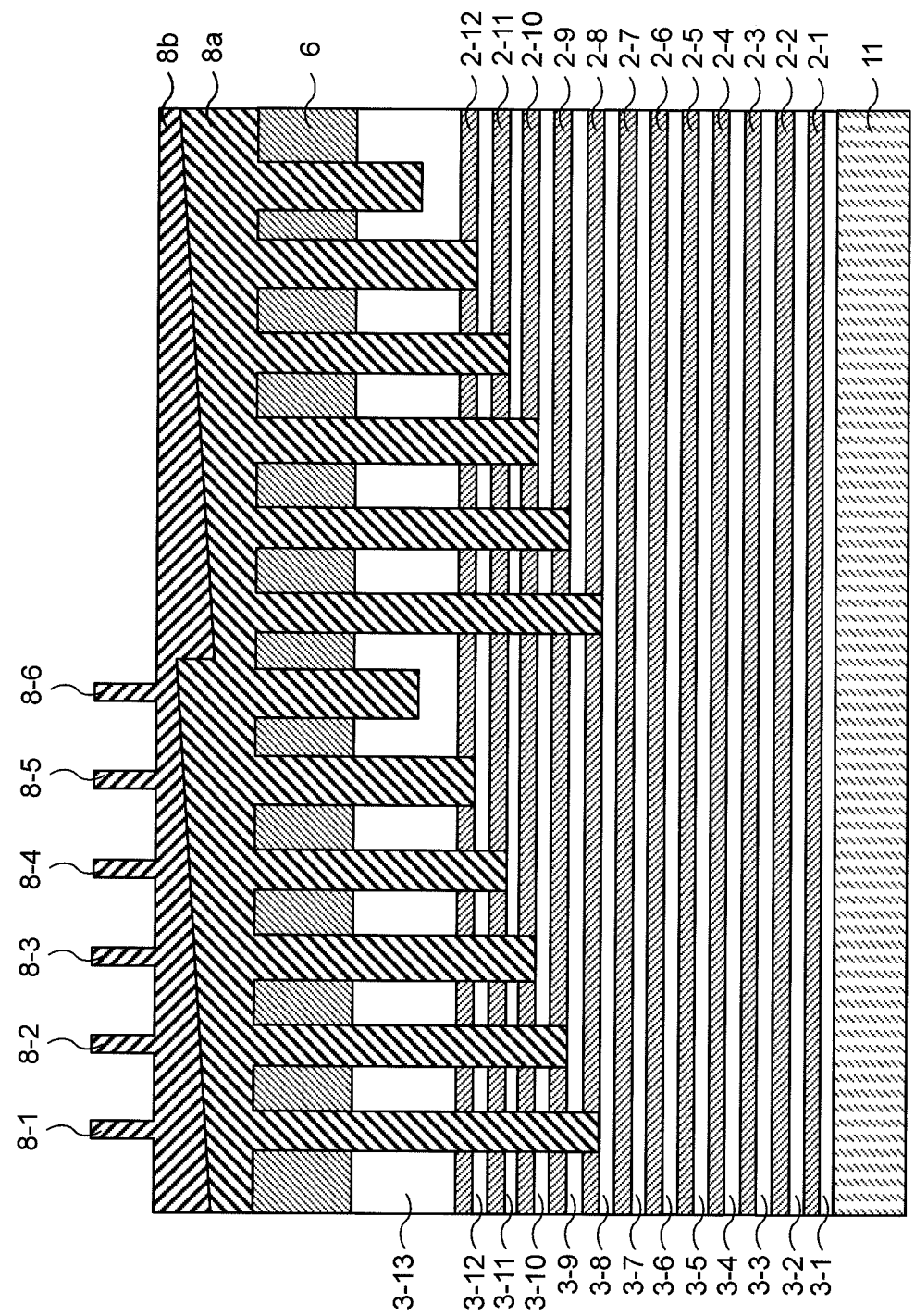
FIG. 17 is a cross-sectional view showing a method of manufacturing a stacked wiring structure according to an embodiment.

Referring to FIG. 16 and FIG. 17, a method of forming a resin layer according to the present embodiment will be described.

As shown in FIG. 16, first applying a resin layer 8a on the top surface of the insulating layer 6 (the surface opposite to the substrate 11 (the first surface)) of the stack body (the insulating film substrate) having the contact hole CHa and the contact hole CHb. The resin layer 8a may be applied, for example, by spin coating. The material of the resin layer 8a may be, for example, a resist, and may be a resin containing a photosensitive agent having photocurability. The material of the resin layer 8a may be, for example, one in which a photoacid generator is added to a material in which a protective group such as an acetal or an alkyl is introduced into a polyhydroxystyrene resin. The resin layer 8a applied to the top surface of the insulating layer 6 is embedded in the contact hole CHa and the contact hole CHb formed in the stack body. On the top surface of the resin layer 8a, the step is formed by the depth of the contact hole CHa and the contact hole CHb disposed in the stack body (the insulating film substrate).

As shown in FIG. 17, a resin layer 8b is applied to the top surface (the surface opposite to the substrate 11 (the first surface)) of the resin layer 8a. The resin layer 8a and the resin layer 8b include a different resin material. The resin layer 8b may be applied by inkjet, for example. The material of the resin layer 8b may be, for example, an NIL resist, and may be a resin containing the photosensitive agent having UV curability. The material of the resin layer 8b may be, for example, one in which the photoinitiator is contained in the acrylic monomer and the surfactant is added.

The resin layer 8b applied to the top surface of the resin layer 8a is embedded in a step formed on the top surface of the resin layer 8a by nanoimprint lithography. Further, the top surface of the resin layer 8b is partially flattened and partially patterned by nanoimprint lithography. Nanoimprint lithography uses a template that is partially flat and partially recessed. By stamping the templates on the resin layer 8b, the top surface of the contact hole CHb of the resin layer 8b is flattened, and the patterns having the convex part 8-1 on the contact hole CH7a, the convex part 8-2 on CH8a, the convex part 8-3 on CH9a, the convex part 8-4 on CH10a, the convex part 8-5 on CH11a, and the convex part 8-6 on CH12a of the resin layer 8b are formed (defined as a convex part 80 when the convex part 8-1 to the convex part 8-6 are not distinguished).

In the method of forming pattern of the stacked wiring structure according to the present embodiment, first by applying the resin layer 8a on the top surface of the insulating layer 6, it is possible to embed the contact hole CHa and the contact hole CHb formed in the stack body. When performing nanoimplant lithography on the resin layer 8b, the lower layer is flatter, so that friction is reduced when stamping the template, and alignment is easier to take. Therefore, in the method of forming wiring of the stacked wiring structure according to the present embodiment, it is possible to improve the manufacturing efficiency and reliability.

Third Embodiment

The configuration of the stacked wiring structure according to the present embodiment is the same as the configuration of the stacked wiring structure according to the first embodiment. The method of manufacturing the stacked wiring structure according to the present embodiment is the same as the method of manufacturing the stacked wiring structure according to the first embodiment except for the method of forming the resin layer. The description is the same as that of the first embodiment will be omitted, here will be described parts different from the method of manufacturing stacked wiring structure according to the first embodiment.

[Method of Manufacturing a Stacked Wiring Structure]

Figure 18:
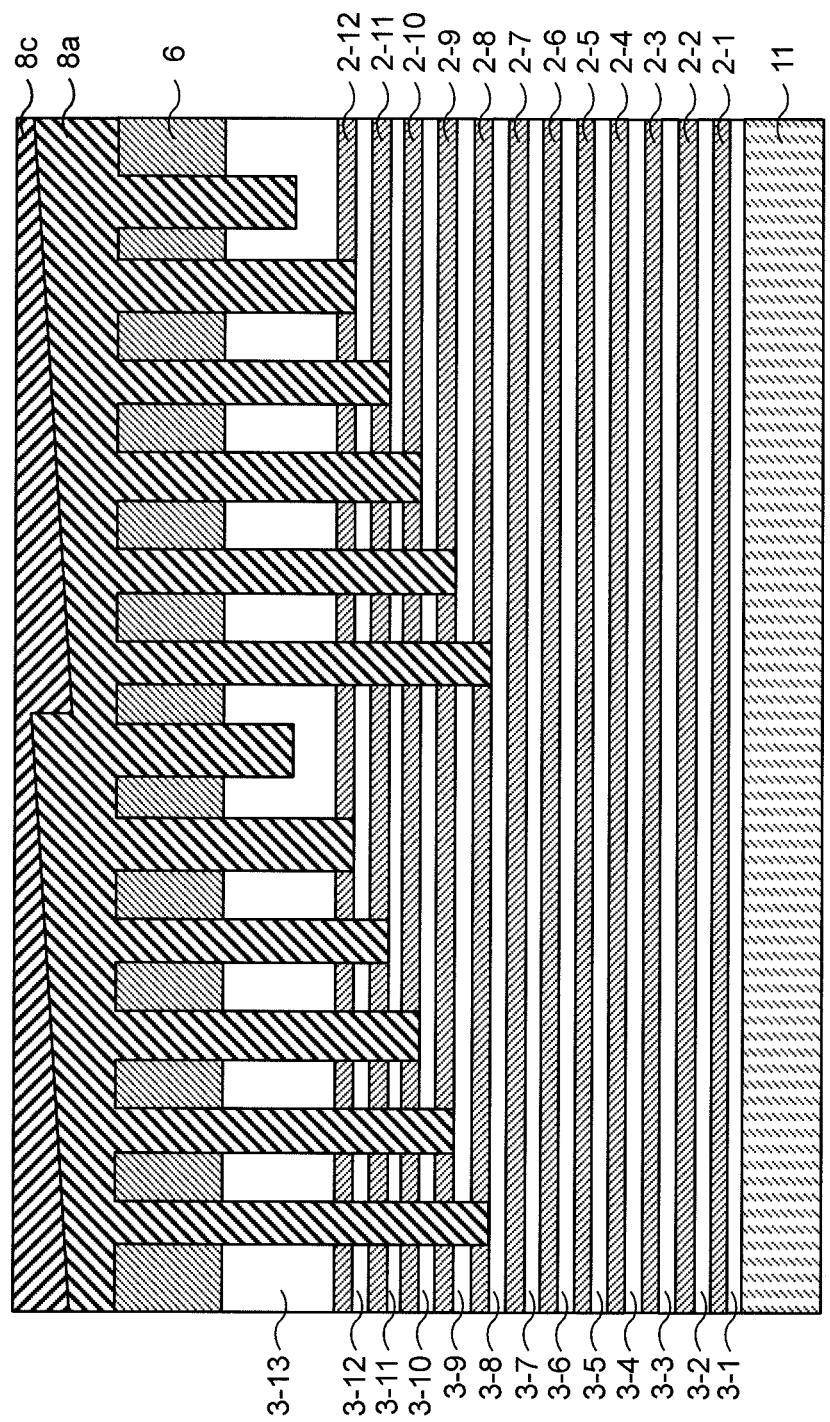
FIG. 18 is a cross-sectional view showing a method of manufacturing a stacked wiring structure according to an embodiment.
Figure 19:
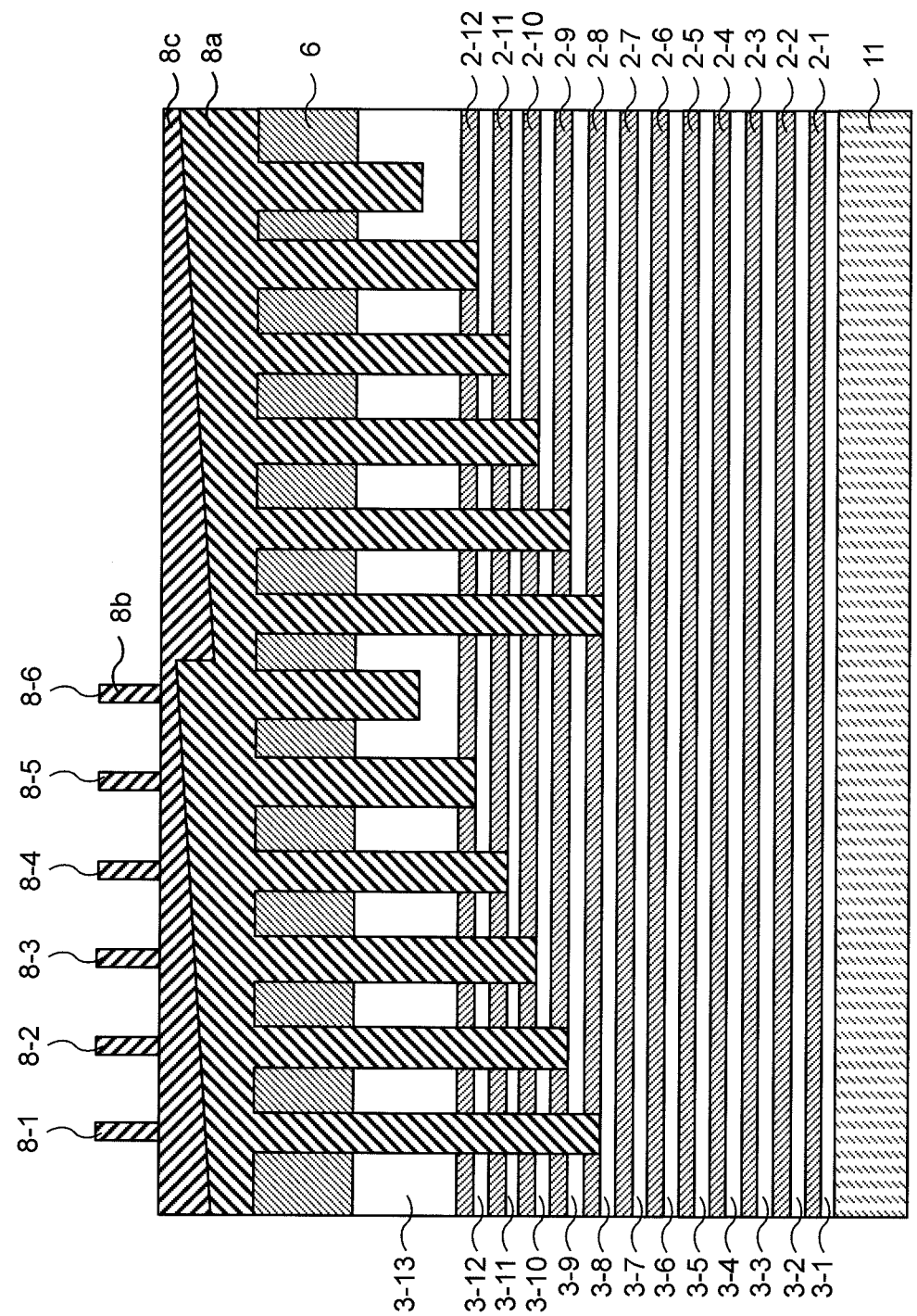
FIG. 19 is a cross-sectional view showing a method of manufacturing a stacked wiring structure according to an embodiment.

Referring to FIG. 18 and FIG. 19, a method of forming a resin layer according to the present embodiment will be described.

First, as shown in the second embodiment, first applying the resin layer 8a on the top surface (the surface opposite to the substrate 11 (the first surface)) of the insulating layer 6 of the stack body (the insulating film substrate) having the contact hole CHa and the contact hole CHb.

As shown in FIG. 18, the resin layer 8c is applied to the top surface (the surface opposite to the substrate 11 (the first surface)) of the resin layer 8a. The resin layer 8a and the resin layer 8b and the resin layer 8c each contain a different resin material. The resin layer 8c may be applied, for example, by spin coating. The material of the resin layer 8c may be, for example, a non-photosensitive resin.

The resin layer 8c applied to the top surface of the resin layer 8a flatten the step formed on the top surface of the resin layer 8a by nanoimprint lithography. Nanoimprint lithography uses a blank template that is substantially flat over its entire surface. By stamping the blank template on the resin layer 8c, the contact hole CHa and the contact hole CHb of the resin layer 8c are flattened.

As shown in FIG. 19, the resin layer 8b is applied to the top surface (the surface opposite to the substrate 11 (the first surface)) of the resin layer 8c. The description of material of the resin layer 8b and patterning by nanoimprint lithography is omitted here because it is the same as the second embodiment.

In the method of forming pattern of the stacked wiring structure according to the present embodiment, apply the resin layer 8c on the top surface of the resin layer 8a to be flattened by nanoimprint lithography. When performing nanoimplant lithography on the resin layer 8b, since the resin layer 8c of the lower layer is flattened more, friction is reduced when stamping the template, and alignment becomes easier. Therefore, in the method of forming wiring of the stacked wiring structure according to the present embodiment, it is possible to improve the manufacturing efficiency and reliability.

While the present invention has been described with reference to the accompanying drawings, the present invention is not limited to the above embodiments, and can be appropriately modified without departing from the spirit of the present invention. For example, a semiconductor device of the present embodiment to which a person skilled in the art adds, deletes, or changes the design of components as appropriate based on the semiconductor device of the present embodiment is also included in the scope of the present invention as long as the spirit of the present invention is provided. Furthermore, the embodiments described above can be appropriately combined as long as there is no mutual inconsistency, and technical matters common to the embodiments are included in the embodiments even if they are not explicitly described.

Even if it is other working effects which differ from the working effect brought about by the mode of each above-mentioned embodiment, what is clear from the description in this specification, or what can be easily predicted by the person skilled in the art is naturally understood to be brought about by the present invention.

What is claimed is:

1. A method of manufacturing semiconductor device comprising:
    applying a resin on a first surface of a first layer, the first layer comprising a first hole having a first depth and a second hole having a second depth;
    forming a pattern on the resin, the pattern comprising a convex part above the first hole, a diameter of the convex part being smaller than a diameter of an opening of the first hole;
    forming a protecting layer exposing a part of the convex part;
    removing the resin in the first hole, the resin in the first hole being connected with the convex part; and
    processing the first hole to form a third hole connecting with the first hole and having a third depth in the first layer below the first hole.

2. The method according to claim 1, wherein the first depth and the second depth are the same depth.

3. The method according to claim 1, wherein the convex part is formed by an imprint lithography.

4. The method according to claim 3, wherein the imprint lithography includes flattening all regions other than the convex part by stamping a template on the resin.

5. The method according to claim 1, wherein
    the resin includes a first resin and a second resin formed above the first resin, the second resin containing a different resin material from the first resin,
    the first resin is embedded in the first hole and the second hole, and
    the pattern is formed on the second resin.

6. The method according to claim 5, wherein
    the resin further comprises a third resin containing a different resin material, the third resin formed between the first resin and the second resin,
    the third resin is flattened.

7. The method according to claim 1, wherein forming the protecting layer includes:
    forming the protecting layer to cover the convex part; and
    exposing a part of the convex part by removing a part of the protecting layer.

8. The method according to claim 7, wherein the resin has a high selectivity with respect to the protecting layer in a first etching for removing a part of the protecting layer.

9. The method according to claim 1, wherein the protecting layer has a high selectivity with respect to the resin in a second etching for removing the resin.

10. The method according to claim 1, wherein the protecting layer having the relationship $H2>(R2/R1) \times H1$,
    wherein H1 is a third depth, H2 is a film thickness of the protecting layer exposing the convex part, R1 is an etching rate of the first layer for forming the third hole, R2 is an etching rate of the protecting layer for forming the third hole.

11. The method according to claim 1, wherein the first layer includes alternately stacked plurality of insulating layers and plurality of sacrificial layers.

12. A method of forming pattern comprising:
    applying a resin on a first surface of a first layer, the first layer comprising a first hole having a first depth and a second hole having a second depth;
    forming a pattern on the resin, the pattern comprising a convex part above the first hole, a diameter of the convex part being smaller than a diameter of an opening of the first hole;
    forming a protecting layer exposing a part of the convex part;
    removing the resin in the first hole, the resin in the first hole being connected with the convex part; and
    processing the first hole to form a third hole connecting with the first hole and having a third depth in the first layer below the first hole.

* * * * *